United States Patent
Wakchaure et al.

(10) Patent No.: US 9,740,419 B2
(45) Date of Patent: Aug. 22, 2017

(54) METHODS AND APPARATUS TO PRESERVE DATA OF A SOLID STATE DRIVE DURING A POWER LOSS EVENT

(71) Applicant: Intel Corporation, Santa Clara, CA (US)

(72) Inventors: Yogesh B. Wakchaure, Folsom, CA (US); Aliasgar Madraswala, Folsom, CA (US); Pranav Kalavade, San Jose, CA (US); Xin Guo, San Jose, CA (US); David Pelster, Longmont, CO (US); Myron Loewen, Loveland, CO (US); Feng Zhu, San Jose, CA (US); Brennan A. Watt, Boulder, CO (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/419,563

(22) Filed: Jan. 30, 2017

(65) Prior Publication Data
US 2017/0139626 A1     May 18, 2017

Related U.S. Application Data

(63) Continuation of application No. 14/884,428, filed on Oct. 15, 2015, now Pat. No. 9,570,159.

(51) Int. Cl.
*G11C 11/34*     (2006.01)
*G06F 3/06*     (2006.01)
*G06F 12/0811*     (2016.01)

(52) U.S. Cl.
CPC ............ *G06F 3/0625* (2013.01); *G06F 3/065* (2013.01); *G06F 3/0619* (2013.01);
(Continued)

(58) Field of Classification Search
CPC ... G11C 16/225; G11C 16/06; G11C 11/4096; G11C 7/10; G11C 7/1096;
(Continued)

(56) References Cited

U.S. PATENT DOCUMENTS 8,391,061 B2   3/2013 Elmhurst et al.
8,788,880 B1   7/2014 Gosla et al.
(Continued)

OTHER PUBLICATIONS

Intel, "Intel Solid-State Drives in Server Storage Applications", Feb. 2014 (24 pages).

(Continued)

*Primary Examiner* — Fernando Hidalgo
(74) *Attorney, Agent, or Firm* — Hanley, Flight & Zimmerman, LLC

(57) ABSTRACT

Methods, apparatus, systems and articles of manufacture to preserve data of a solid state drive during a power loss event are disclosed. An example method includes setting an alternate data cache ($PDC_1$) to a logical AND of a secondary data cache (SDC) and a primary data cache ($PDC_0$). The $PDC_1$ is set to a logical AND of the $PDC_1$ and a first result of a first sense operation. The $PDC_0$ is set to a logical AND of the $PDC_0$ and an inverse value of the $PDC_1$. The $PDC_1$ is set to a logical AND of the SDC and the $PDC_0$. The $PDC_1$ is set to a logical AND of the $PDC_1$ and an inverse value of a second result of a second sense operation. The SDC is set to a logical AND of the SDC and the $PDC_0$. The SDC is set to a logical OR of the SDC or the $PDC_0$. The $PDC_0$ is set to a logical AND of the $PDC_0$ and a third result of a third sensing operation.

20 Claims, 10 Drawing Sheets

(52) U.S. Cl.
CPC ........ *G06F 3/0688* (2013.01); *G06F 12/0811* (2013.01); *G06F 2212/283* (2013.01)

(58) Field of Classification Search
CPC .... G11C 2211/4067; G11C 2207/2227; G11C 29/83; G11C 5/144; G06F 1/3237
USPC .......... 365/185.04, 185.18, 189.011, 189.17, 365/189.16, 226, 227, 228, 229
See application file for complete search history.

(56) References Cited

U.S. PATENT DOCUMENTS

| | | | |
|---|---|---|---|
| 9,547,496 B2 * | 1/2017 | Burger | G06F 9/3836 |
| 9,570,159 B1 | 2/2017 | Wakchaure et al. | |
| 2006/0184736 A1 | 8/2006 | Benhase et al. | |
| 2007/0005928 A1 | 1/2007 | Trika et al. | |
| 2011/0080789 A1 | 4/2011 | Kalavade et al. | |
| 2014/0269053 A1 | 9/2014 | Chen et al. | |
| 2015/0046747 A1 | 2/2015 | Gaertner et al. | |

OTHER PUBLICATIONS

Cai, Yu et al., "Threshold Voltage Distribution in MLC NAND Flash Memory: Characterization, Analysis and Modeling," Proceedings of the Conference on Design, Automation & Test in Europe, (2013), ISBN: 978-1-4503-2153-2 (6 pages).

United States Patent and Trademark Office, "Non-Final Office Action", issued in connection with U.S. Appl. No. 14/884,428, dated Jun. 8, 2016 (8 pages).

United States Patent and Trademark Office, "Notice of Allowance", issued in connection with U.S. Appl. No. 14/884,428, dated Oct. 3, 2016 (10 pages).

International Searching Authority, "Search Report and Written Opinion", issued in connection with International Application No. PCT/US2016/051474, dated Dec. 22, 2016 (12 pages).

* cited by examiner

Table 601:

| | SDC | PDC$_0$ | OPERATION 1<br>PDC$_1$ =<br>SDC & PDC0 | OPERATION 2<br>SA$_{OUT}$ =<br>R$_3$ SENSE | OPERATION 3<br>PDC$_1$ =<br>PDC$_1$ & SA$_{OUT}$ | OPERATION 4<br>PDC$_0$ =<br>$\overline{PDC_1}$ & PDC$_0$ |
|---|---|---|---|---|---|---|
| L$_0$ | 1 | 1 | 1 | 0 | 0 | 1 |
| L$_1$ PASS | 1 | 1 | 1 | 0 | 0 | 1 |
| L$_2$ PASS | 1 | 1 | 1 | 0 | 0 | 1 |
| L$_3$ PASS | 1 | 1 | 1 | 1 | 1 | 0 |
| L$_1$ FAIL | 0 | 1 | 0 | 0 | 0 | 1 |
| L$_2$ FAIL | 0 | 0 | 0 | 0 | 0 | 0 |
| L$_3$ FAIL | 1 | 0 | 0 | 0 | 0 | 0 |

Table 602:

| | SDC | PDC$_0$ | OPERATION 5<br>PDC$_1$ =<br>SDC & PDC0 | OPERATION 6<br>SA$_{OUT}$ =<br>R$_1$ SENSE | OPERATION 7<br>PDC$_1$ =<br>PDC$_1$ & $\overline{SA_{OUT}}$ | OPERATION 8<br>SDC =<br>SDC & $\overline{PDC_0}$ | OPERATION 9<br>SDC =<br>SDC \| PDC$_1$ |
|---|---|---|---|---|---|---|---|
| L$_0$ | 1 | 1 | 1 | 0 | 1 | 0 | 1 |
| L$_1$ PASS | 1 | 1 | 1 | 1 | 0 | 0 | 0 |
| L$_2$ PASS | 1 | 1 | 1 | 1 | 0 | 0 | 0 |
| L$_3$ PASS | 1 | 0 | 0 | 1 | 0 | 1 | 1 |
| L$_1$ FAIL | 0 | 1 | 0 | 0 | 0 | 0 | 0 |
| L$_2$ FAIL | 0 | 0 | 0 | 1 | 0 | 0 | 0 |
| L$_3$ FAIL | 1 | 0 | 0 | 1 | 0 | 1 | 1 |

Table 603:

| | SDC | PDC$_0$ | OPERATION 10<br>SA$_{OUT}$ =<br>R$_2$ SENSE | OPERATION 11<br>PDC$_0$ =<br>PDC$_0$ & $\overline{SA_{OUT}}$ |
|---|---|---|---|---|
| L$_0$ | 1 | 1 | 0 | 1 |
| L$_1$ PASS | 0 | 1 | 0 | 1 |
| L$_2$ PASS | 0 | 1 | 1 | 0 |
| L$_3$ PASS | 1 | 0 | 1 | 0 |
| L$_1$ FAIL | 0 | 1 | 0 | 1 |
| L$_2$ FAIL | 0 | 0 | 0 | 0 |
| L$_3$ FAIL | 1 | 0 | 0 | 0 |

Table 604:

| | SDC | PDC$_0$ |
|---|---|---|
| L$_0$ | 1 | 1 |
| L$_1$ PASS | 0 | 1 |
| L$_2$ PASS | 0 | 0 |
| L$_3$ PASS | 1 | 0 |
| L$_1$ FAIL | 0 | 1 |
| L$_2$ FAIL | 0 | 0 |
| L$_3$ FAIL | 1 | 0 |

FIG. 6

METHODS AND APPARATUS TO PRESERVE DATA OF A SOLID STATE DRIVE DURING A POWER LOSS EVENT

RELATED APPLICATION

This patent arises from a continuation of U.S. patent application Ser. No. 14/884,428, filed on Oct. 15, 2015, and entitled "METHODS AND APPARATUS TO PRESERVE DATA OF A SOLID STATE DRIVE DURING A POWER LOSS EVENT." U.S. patent application Ser. No. 14/884,428 is hereby incorporated herein by reference in its entirety.

FIELD OF THE DISCLOSURE

This disclosure relates generally to solid state drives and, more particularly, to methods and apparatus to preserve data in flash memories of solid state drives during power loss events.

BACKGROUND

In a solid state drive (SSD), the SSD must go through an orderly shutdown in the event of a loss of power to prevent corruption or loss of data. In particular, in the event of a loss of power, the SSD must complete all in progress data writes and provide a controlled shutdown of the media and firmware. SSDs may include a power loss system that provides sufficient energy to complete these in process data writes and allow for a controlled shutdown of the SSD. For example, a set of power loss capacitors may be used to provide sufficient energy storage to provide power for shutdown operations in the event of a loss of power.

BRIEF DESCRIPTION OF THE DRAWINGS

FIG. 6 is a table of data representing various states of memory during a data recovery operation.

The figures are not to scale. Wherever possible, the same reference numbers will be used throughout the drawing(s) and accompanying written description to refer to the same or like parts.

DETAILED DESCRIPTION

Figure 1:
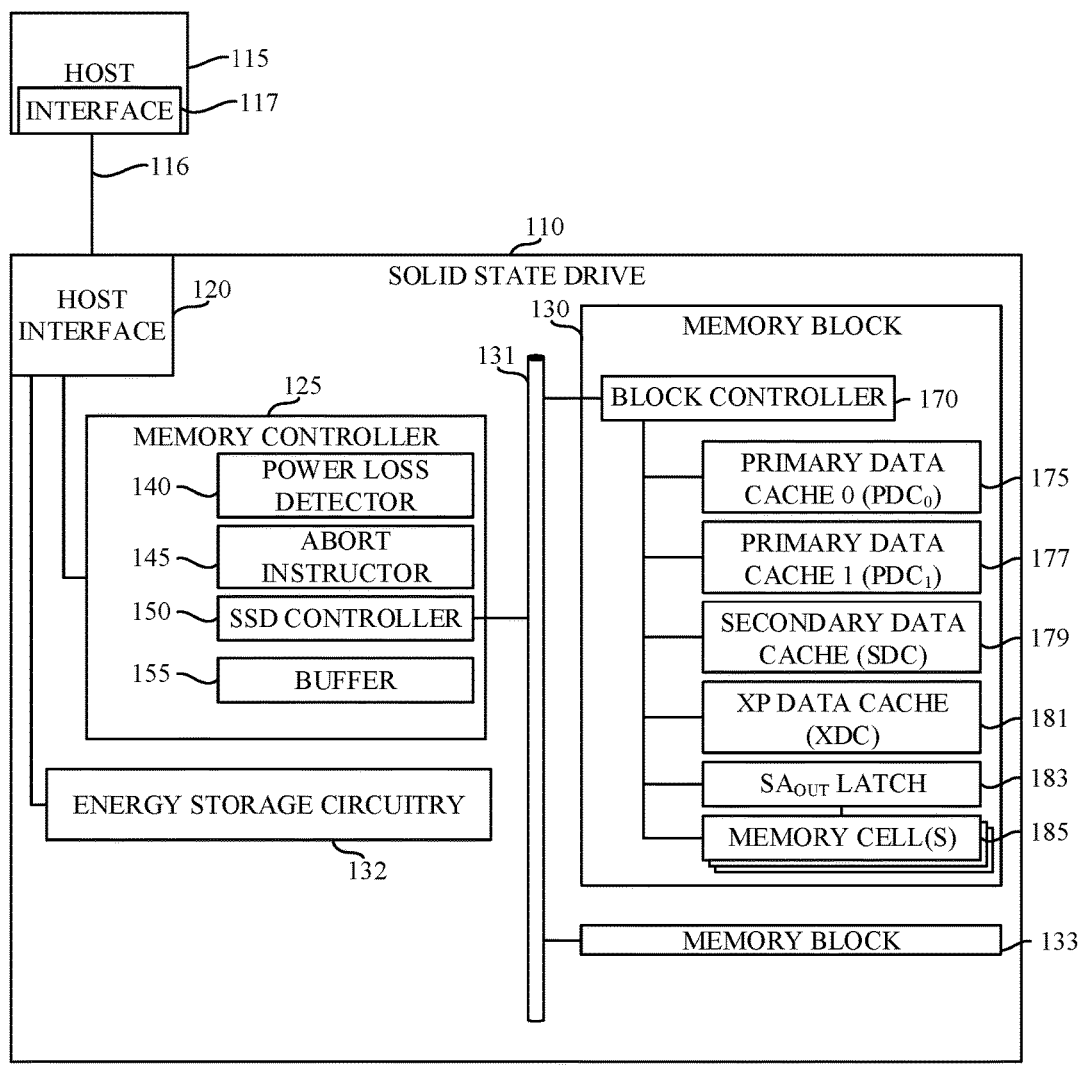
FIG. 1 is an example solid state drive within an example environment of use.

NAND flash memory is a type of non-volatile memory that may be included in an SSD to store data. Some NAND flash memories such as Single Level Cell (SLC) NAND flash memories store one bit of data per cell. Some NAND flash memories such as Multi-Level Cell (MLC) NAND flash memories store multiple bits of data per cell (e.g., two bits, three bits, etc.). In some examples, MLC NAND flash memories are configurable to store different numbers of bits per cell. For example, a memory controller may configure one region of a MLC NAND flash memory to operate in SLC mode (e.g., one bit per cell (1 bpc)), and configure another memory region to operate in a multiple bpc MLC mode. In examples disclosed herein, two bit per cell MLC (2 bpc MLC) is used to refer to MLC memories that store two bits of data per cell. In some examples, MLC mode memories that store three bits of data per cell are referred to as Triple Level Cell (TLC) memories. As used herein, MLC mode memories are hereby defined to include TLC mode memories. MLC memories enable greater data densities (e.g., multiple bits of data per cell) than SLC memories. However, MLC memories take longer (e.g., have slower write speeds or longer write times) to write the same data relative to SLC memories. For example, SLC memories can be written approximately seven to eight times faster than TLC memories because writing one bit per cell requires less programming pulses to change electrical characteristics of a SLC flash memory cell to represent one bit, and writing multiple bits per cell requires more programming passes.

During a power failure (e.g., a power outage, a failure of a power supply, etc.), data that is not already written to a non-volatile memory of an SSD may be lost. In some examples, data loss can be severe and result in corruption of data stored in non-volatile memory in the SSD. To prevent data loss and/or data corruption, energy storage circuitry is included in a housing of the SSD. For example, the energy storage circuitry may be a capacitor that stores energy allow the SSD to complete some operations after main power is lost. For example, the energy storage circuitry ensures that there is enough energy stored to facilitate completion of unfinished write operations and/or other cleanup operations. Examples disclosed herein facilitate reducing the amount of time that such unfinished write and cleanup operations require. In this manner, examples disclosed herein facilitate reducing an amount of energy (e.g., stored energy) that needs to be relied upon to ensure completion of those operations and, thus, reducing the amount and/or size of energy storage components (e.g., capacitors, batteries, etc.) needing to be included in an SSD. Decreasing the size and/or quantity of energy storage components based on examples disclosed herein can be used to decrease physical sizes of SSDs and/or reallocate physical space in SSDs for other components (e.g., additional memory capacity), and/or decreases costs of the SSDs. For example, utilizing approaches disclosed herein enables creating smaller form factors for products having limited physical space to support energy storage devices (e.g., capacitors).

Prior approaches for protecting data involve two operations. First, all existing write instructions transferred from a controller of the SSD to a memory block of the SSD are completed. Such write instructions are completed to protect data because prior controllers utilize a fire-and-forget policy. As such, once an instruction to write data is transmitted from the controller to the memory block, the controller clears that data from its cache (volatile memory). Second, after completion of the outstanding writes, prior techniques write any remaining data in the cache of the controller to an alternate location of the non-volatile memory block in an SLC mode using the fire-and-forget policy.

Examples disclosed herein reduce an amount of time and/or energy used for completion of existing write instructions. When writing data to a memory cell (e.g., a NAND flash memory cell), an electrical characteristic of the memory cell is modified until the memory cell produces a threshold voltage level (Vt) representative of a bit value or bit values intended to be written to that memory cell. For example, numerous programming pulses that involve applying voltage pulses to a memory cell are used to change an electron charge on a floating gate of a transistor of the memory cell. Changing the electron charge changes the amount of electrical current that flows through the transistor. The amount of current flow is proportional to a resulting threshold voltage level (Vth) of that memory cell which is, in turn, representative of the binary value(s) stored in the memory cell. In an SLC mode memory cell, two different threshold voltage levels (Vt) are used to represent a single bit of data (e.g., $V_0 \rightarrow b_0=0$; $V_1 \rightarrow b_0=1$). Such single bit of data is referred to as lower page (LP) data. In a 2 bpc MLC mode memory cell, four different voltage levels may be used to represent two bits of data (e.g., $V_0 \rightarrow b_0=0$, $b_1=0$; $V_1 \rightarrow b_0=0$, $b_1=1$; $V_2 \rightarrow b_0=1$, $b_1=0$; and $V_3 \rightarrow b_0=1$, $b_1=1$). The first bit of data is lower page (LP) data, and the second bit of data is referred to as upper page (UP) data. In a TLC mode memory cell, eight different threshold voltage levels (Vt) may be used to represent three bits of data. The first bit is LP data, the second bit is UP data, and third bit of data is referred to as extra page (XP) data. Writing data to an SLC mode memory cell (e.g., one bit per cell) may take approximately one millisecond. Writing data to a 2 bpcMLC mode memory cell (e.g., two bits per cell) may take approximately three milliseconds. Writing data to a TLC mode memory cell (e.g., three bits per cell) may take approximately five milliseconds. As such, writing additional bits per cell does not result in a linear additional amount of time. In some examples, further modes and/or levels of operation may additionally or alternatively be used, such as, for example, a Quad Level Cell (QLC) mode to store 4 bits per cell (e.g., a 4 bpc MLC), etc.

In examples disclosed herein, the amount of time used for completion of existing write instructions is reduced by aborting any ongoing UP and/or XP writes upon detection of a power loss. In some cases, a memory cell may have been in the process of a programming phase to transition between threshold voltage levels such that the data represented by the voltage level at the time of the abort no longer represents the data that was previously stored in the memory cell before beginning the aborted programming phase. For example, after finishing the programming phase to write LP and UP data in a 3 bpc memory cell, the electrical characteristics of the 3 bpc memory cell are configured to output a threshold voltage level representative of its programmed two bits (e.g., LP and UP data). Subsequently, a next programming phase is used to apply numerous programming pulses to the memory cell to change its electrical characteristics to provide a different threshold voltage level representative of a third bit of data (e.g., XP data) in combination with the already programmed LP data and UP data. If such next programming phase is aborted after some programming pulses have already been applied, a change in electrical characteristics of the 3 bpc memory cell is not complete, meaning that the threshold voltage level produced by the 3 bpc memory cell neither represents the previously programmed LP data and UP data, nor the intended combination of LP, UP, and XP data.

In examples disclosed herein, multi-bit data in the process of being written to a MLC memory cell when a power loss occurs can be preserved or protected by either completing the writing of the intended multi-bit data to the originally intended MLC memory cell by completing the multiple LP, UP, XP, etc. programming phases to finish completely writing the intended multi-bit data to that MLC memory cell. In some examples, the intended multi-bit data can be separated into separate bits written to separate SLC mode memory cells.

In some examples, the reference voltages used for the threshold voltage distribution that was previously used to store data in a first memory cell of a first memory block (e.g., LP data and UP data) are re-established using modified reference voltages. The memory cell is then pulsed to re-capture the UP data as previously written to the cell. In this manner, the UP data is effectively re-written or restored using the modified reference voltages and modified threshold voltage distribution. In some examples, the data that was in the process of being programmed (e.g., XP data) when the power loss occurred is written to a second memory cell as LP data. In some examples, the second memory cell is a memory cell included within the first memory block where the data was being written. For example, the second memory cell may be a subsequent unused memory cell within the first memory block. However, the second memory cell may be included in any other memory block such as, for example, a second memory block separate from the first memory block.

In some other examples, the data that was previously programmed in a first memory cell of a first memory block (e.g., during LP and UP programming phases) is recovered (e.g., data that had already been written). Likewise, the data that was in the process of being programmed to the first memory cell of the first memory block (e.g., during a started but not finished XP programming phase) is also recovered. In some examples, both the data that was previously programmed and the data that was in the process of being programmed are re-written to memory cell(s) within a second memory block that does not include the first memory cell from which the data was recovered. In some examples, the second memory block is operated using a dedicated SLC mode. For example, the data to be written to the first memory (operated using a TLC mode, and including LP, UP, and XP data) may be written to three separate memory cells within the second memory block.

In some examples, data in the aborted memory block is left in the state at the time of the abortion. That is, the threshold voltage ($V_t$) of the memory cell is left at the value at the time of the abort operation. In some examples, upon restoration of power, the write (e.g., pulsing) operation is resumed using the threshold voltage (Vt) from the time of the abort. Using the threshold voltage ($V_t$) from the time of the abort reduces an overall amount of time to write the data to the aborted cell upon power restoration because, for example, part of the write operation had already been completed (e.g., prior to the loss of power supplied by energy storage circuitry of the SSD).

In examples disclosed herein, the overall delay associated with writing data after a power loss can include approximately fifty microseconds for the memory cell to abort an existing write operation, approximately five hundred microseconds to recover all page data that was being written to the memory cell, approximately two thousand microseconds to re-program LP and UP data to the memory cell, and approximately five hundred microseconds to write the recovered XP data as LP data to a second memory cell. In such an example, the delay is approximately three thousand and fifty microseconds. In contrast, delays associated with completing outstanding writes to TLC memory are approximately five thousand microseconds. As a result, a reduction of time to complete outstanding writes is reduced by approximately forty percent.

In some other examples, not re-programming the LP and/or UP data to the memory cell, but instead writing the UP, LP, and/or XP data to separate memory cells operated in a dedicated SLC mode may result in further reductions in an amount of time to preserve data. For example, aborting ongoing writes, recovering the data to be written, and re-establishing the data to be written using a modified threshold voltage distribution may take approximately two thousand micro seconds. As noted above, when the amount of time used to complete outstanding write operations is reduced, the amount of energy that needs to be stored in energy storage circuitry is likewise reduced.

FIG. 1 is a block diagram illustrating an example solid state drive (SSD) 110 within an example environment of use. The example SSD 110 communicates with a host 115 having an interface 117 via an interconnect 116. In examples disclosed herein, the SSD 110 includes a host interface 120 to send and/or receive data via the interconnect 116. An example memory controller 125 of the SSD 110 receives data via the host interface 120 to be written to a memory block 130 (e.g., memory blocks in a NAND device). The example memory controller 125 communicates with the memory block 130 using a bus 131. In the event of a power loss, energy stored by the energy storage circuitry 132 facilitates completion of ongoing write operations to ensure that (1) all data to be written (e.g., data that is to be written per a power Loss recovery policy) is properly written and (2) that no data is corrupted. The example memory controller 125 includes an example power loss detector 140, an example abort instructor 145, an example SSD controller 150, and an example buffer 155. The example memory block 130 includes an example block controller 170, an example primary Data cache 0 ($PDC_0$) 175, an example primary data cache 1 ($PDC_1$) 177, an example secondary data cache (SDC) 179, an example XP data cache (XDC) 181, an example sense latch ($SA_{OUT}$) 183, and an example memory cell 185.

The example host 115 of the illustrated example of FIG. 1 is a computing system. In some examples, the host 115 is implemented by a personal computer (e.g., a desktop computer, a laptop computer, etc.). However, the host 115 may be implemented by any other hardware and/or software. For example, the host 115 may be a smartphone, a television, a set top box, a printer, a home automation system, etc. That is, the host 115 may be any type of computing system capable of writing data to the SSD 110. In some examples, the host 115 includes the interface 117 that communicates with the example host interface 120 of the SSD 110 using a Serial Advanced Technology Attachment (SATA) interconnect 116. However, any other type of communication interconnect or link may additionally or alternatively be used such as, for example, a Parallel Advanced Technology Attachment (PATA) interconnect developed by the American National Standards Institute (ANSI) as standard no. X3.221-1994, a Serial Advanced Technology Attachment (SATA) interconnect developed by the Serial ATA International Organization (Serial ATA Revision 3.0), a Small Computer System Interface (SCSI) interconnect, a Serial-Attached SCSI (SAS) interconnect developed by the T10 group as standards document InterNational Committee for Information Technology Standards (INCITS) 534, Peripheral Component Interconnect (PCI) express (PCIe) interconnect developed by the PCI Special Interests Group (PCI-SIG) as the PCI Express Base Specification (current revision 3.1), a Non-Volatile Memory (NVMe) interconnect developed by the NVM Express, Inc. (current revision 1.2), etc.

The example host interface 120 of the illustrated example of FIG. 1 receives data to be written to the memory blocks 130, 133 from the host 115. In examples disclosed herein, the example host interface 120 is implemented using a single SATA port. However, any other number and/or type of interface may additionally or alternatively be used. Data received by the example host interface 120 is forwarded to the example memory controller 125.

In some examples, the memory blocks 130, 133 are implemented as separate memory hardware instances and/or may be included in separate memory dies. In some examples, a first memory block (e.g., the memory block 130) is operated using a triple level cell (TLC) mode. In some examples, a second memory block (e.g., the memory block 133) is operated using a dedicated single level cell (SLC) mode. Operating using the dedicated SLC mode results in lower memory density compared to operating using the TLC mode (e.g., less data may be stored across the same number of memory cells when using SLC mode as compared to the TLC mode). However, using the dedicated SLC mode results in faster write times than writing the same data as compared to the TLC mode (e.g., a lower page of data being written to a memory cell operating in TLC mode). Moreover, the dedicated SLC mode uses less energy to write data as compared to the writing the data to memory operating in the TLC mode.

The example memory controller 125 of the illustrated example of FIG. 1 is implemented by a hardware processor (e.g., a silicon based processor). However, any other type of circuitry may additionally or alternatively be used such as, for example an analog or digital circuit(s), a logic circuit, a programmable processor(s), an application specific integrated circuit(s) (ASIC(s)), a programmable logic device(s) (PLD(s)) and/or field programmable logic device(s) (FPLD(s)). The example memory controller 125 of the illustrated example of FIG. 1 receives write requests from the host 115 via the host interface 120, and writes the requested data to the memory blocks 130. As noted above, the example memory controller 125 includes the example power loss detector 140, the example abort instructor 145, the example SSD controller 150, and the example buffer 155.

The example power loss detector 140 of the illustrated example of FIG. 1 monitors whether power is being provided to the solid state drive 110 via the host interface 120 and/or a separate interface that receives power. In some examples, the example energy storage circuitry 132 may supply power for longer than a momentary power outage (e.g., external power may be restored prior to needing to initiate a data protection operation). As such, in some examples, the example power loss detector 140 may monitor the energy storage circuitry 132 to identify an available energy remaining, and may identify a power loss event when the available energy remaining is below a power threshold.

The example abort instructor 145 of the illustrated example of FIG. 1 transmits an abort command to the memory block 130, 133 upon the power loss detector 140 indicating that a power loss event has been detected. In the illustrated example, the abort command is an abort instruction. However, any other approach to instructing the memory block 130 to abort ongoing write operations may additionally or alternatively be used. For example, the example abort instructor 145 may toggle a write protect (WP) pin monitored by the memory block 130. In some examples, the example abort instructor 145 transitions the WP pin from a first value to a second value (e.g., from a one to a zero (0-1), from a zero to a one (1-0)). In some examples, the example abort instructor 145 toggles the WP pin temporarily (e.g., from a one to a zero to a one (0-1-0), from a zero to a one to a zero (1-0-1)). In some examples, the abort instructor 145 instructs the memory block 130 to abort ongoing erase commands by, for example, transmitting an erase command on a command bus. In some examples, erase commands can take between three milliseconds (3 ms) and ten milliseconds (10 ms). In some examples, the abort instructor 145 instructs the example memory block 130 to abort a particular type(s) of operation. For example, the example abort instructor 145 may instruct the memory block 130 to abort long duration operations such as, for example, an XP program operation, an XP erase operation, etc. Likewise, the example abort instructor 145 may instruct the memory block 130 to not abort shorter duration operations such as, for example an LP program operation, a UP program operation, etc.

The example SSD controller 150 of the illustrated example of FIG. 1 receives, via the host interface 120, data to be written, and stores the data in the buffer 155. The example SSD controller 150 then instructs the block controller 170 of the memory block 130 to write the data from the buffer 155 to memory cell(s) 185 of the memory block 130. In examples disclosed herein, the example SSD controller 150 operates in a fire-and-forget mode of operation. As such, once the example SSD controller 150 transmits the data to be written from the buffer 155 to the memory block 130, the SSD controller 150 may overwrite the memory location of the data to be written in the buffer 155 with other data to be written (e.g., subsequent data received from the host 115 via the host interface 120).

In the event of a power loss event (e.g., as detected by the power loss detector 140), the data stored in the buffer 155 may not fully represent all of the data to be written (e.g., some of the data already transmitted to the memory block 130 from the buffer 155 may have been overwritten in the buffer 155 by subsequent data to be written to the memory block 130). To recover the data, the example SSD controller 150 communicates with the memory block 130 to identify data that was in the process of being written (e.g., aborted data) and/or data that had already been written to an aborted memory cell, such that the data can be programmed in a more time-efficient and/or power-efficient manner. For example, if the memory block 130 aborted writing of LP/UP/XP data (e.g., a TLC write), the LP and UP data may be re-established using a modified voltage threshold distribution (e.g., the fourth threshold voltage distribution 290 of FIG. 2A) (e.g., written in a 2 bpc MLC mode), and the XP data may be written to a separate memory location (e.g., using an SLC mode). In some examples, different portions of the recovered data (e.g., the LP/UP/XP data) may be written to separate memory locations operated in a dedicated SLC mode (e.g., the UP data may be written to a first memory location, the LP data may be written to a second memory location, the XP data may be written to a third memory location, etc.). Moreover, in some examples, further memory modes of operation may also be protected. For example, if data were written in a Quad Level Cell (QLC) mode, data being written (e.g., four pages of data) may be recovered using the example approaches disclosed herein, to protect the data that was in the process of being written at the time of the power loss event.

The buffer 155 of the illustrated example of FIG. 1 stores data received from the host 115 via the host interface 120 while the data is queued to be transmitted to the memory block 130. In examples disclosed herein, the buffer 155 is implemented as an application specific integrated circuit (ASIC). However, any other approach to implementing a buffer may additionally or alternatively be used. For example, the example buffer 155 may be implemented in a memory die.

The example energy storage circuitry 132 of the illustrated example of FIG. 1 is implemented by one or more capacitors. However, the example energy storage circuitry 132 may be implemented in any other fashion such as, for example, by a battery, by a super capacitor, etc. Any number(s) and/or type(s) of energy storage circuitry may be used.

In the illustrated example of FIG. 1, one memory block 130 is shown. In the illustrated example, the memory block 130 is operated in a TLC mode. However, the memory block 130 may be operated in any other mode. The example memory block 130 of the illustrated example of FIG. 1 includes the block controller 170, the primary data cache 0 ($PDC_0$) 175, the primary data cache 1 ($PDC_1$) 177, the secondary data cache (SDC) 179, the XP data cache (XDC) 181, the sense latch ($SA_{OUT}$) 183, and the memory cell 185. In some examples, the $PDC_0$ 175, the $PDC_1$ 177, the SDC 179, and the XDC 181 are referred to as a state page buffer (SPC).

In practice, additional memory block(s) 133 will be used to accommodate additional memory storage capacity. In some examples, the additional memory block(s) 133 are operated in a dedicated SLC mode. That is, while a first memory block (e.g., the memory block 130) is operated in the TLC mode, a second memory block (e.g., the memory block 133) is operated in the dedicated SLC mode (e.g., a mode different from the mode of operation of the first memory block). In some examples, the second memory block 133 is included for the express purpose of providing memory operated in an SLC mode to be used upon detection of a power loss event. That is, the second memory block 133 is not used to store information during normal operation of the SSD 110 but, instead, is utilized upon detection of the power loss event.

The example block controller 170 of the illustrated example of FIG. 1 receives instructions from the example abort instructor 145 and/or the example SSD controller 150 via the example bus 131. In some examples, the instructions are write instructions and include data to be written to the memory cell 185. In some examples, the instructions are abort instructions that cause the block controller 170 to cease writing data to the memory cell 185. However, any other instructions may additionally and/or alternatively be received by the block controller 170.

In examples disclosed herein, the $PDC_0$ 175, the $PDC_1$ 177, the SDC 179, and the XDC 181 are implemented as memory caches. In some examples, the $PDC_0$ 175, the $PDC_1$ 177, the SDC 179, and the XDC 181 are implemented as volatile memory such as, for example, Synchronous Dynamic Random Access Memory (SDRAM), Dynamic Random Access Memory (DRAM), RAMBUS Dynamic Random Access Memory (RDRAM) and/or any other type of random access memory device. When the block controller 170 writes data to the memory cell 185, the data to be written is stored in the $PDC_0$ 175, the $PDC_1$ 177, the SDC 179, and/or the XDC 181 while the data is being written to the memory cell 185.

The example sense latch ($SA_{OUT}$) 183 of the illustrated example of FIG. 1 is implemented using a transistor circuit. The example sense latch ($SA_{OUT}$) 183 of FIG. 1 is used to read a state of the memory cell 185 at varying voltages. In some examples, the sense latch ($SA_{OUT}$) 183 is implemented using a flip-flop. However, the example sense latch ($SA_{OUT}$) 183 may be implemented in any other fashion.

The example memory cell 185 of the illustrated example of FIG. 1 is implemented using a non-volatile memory, such as, for example a NAND flash memory. However, any other type of non-volatile memory may additionally or alternatively be used. For example, NOR flash memory, three dimensional cross-point (3D Cross-point) memory, ferroelectric memory, silicon-oxide-nitride-oxide-silicon (SONOS) memory, polymer memory such as ferroelectric polymer memory, ferroelectric transistor random access memory (FeTRAM or FeRAM), nanowire, phase change memory, phase change memory with switch, magnetoresistive random access memory (MRAM), spin transfer torque (STT) memory, etc. may additionally or alternatively be used. In practice, the memory block 130 will include multiple memory cells. In the illustrated example, the memory cell 185 is written by storing a charge (e.g., electrons) on the memory cell 185. In examples disclosed herein, the charge is stored by applying a pulse (e.g., a pulse having a voltage between fifteen volts (15V) and twenty volts (20V)) to the memory cell 185. The pulse, when applied, modifies a threshold voltage ($V_t$) of the underlying transistor(s) of the memory cell 185. However, any other approach to writing data to a memory cell may additionally or alternatively be used.

In examples disclosed herein, when pulsing the example memory cell 185 to store additional pages of data in the cell, the threshold voltage ($V_t$) value of the cell is increased. However, any other approach to modifying the threshold voltage ($V_t$) value of the cell may additionally or alternatively be used.

Figure 2A:
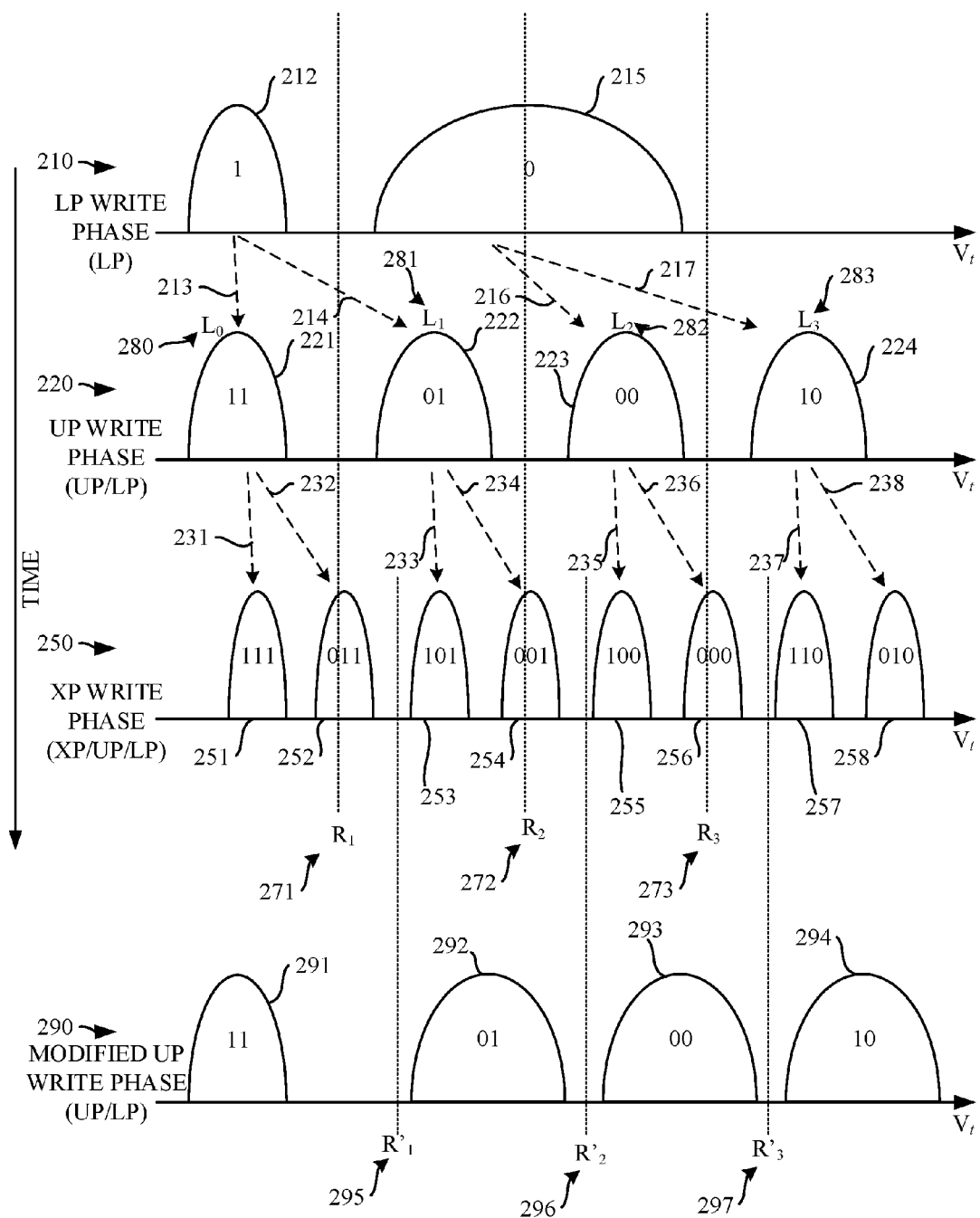
FIGS. 2A and 2B are diagrams representing different threshold voltage distributions of multi-level cell (MLC) memory cells following numerous programming passes over time to store three bits per cell.

FIG. 2A is a diagram representing different threshold voltage distributions of corresponding to write phases of an MLC cell (e.g., a TLC cell), that may be used to implement the example memory cell 185 of FIG. 1. A first threshold voltage distribution 210 corresponds to an LP write phase of the write operation to write LP data to a memory cell. In some examples, memories that utilize only the first threshold voltage distribution 210 are referred to as operating in a single level cell (SLC) mode.

A second threshold voltage distribution 220 corresponds to a UP write phase of the write operation to write UP data to the memory cell. In the illustrated example of FIG. 2A, the second threshold voltage distribution 220 represents two bits of data. A first bit of data represented by the second threshold voltage distribution 220 (e.g., the 2 bpc MLC mode) corresponds to LP data, and a second bit of the second threshold voltage distribution 220 corresponds to UP data.

A third threshold voltage distribution 250 corresponds to an XP write phase of the write operation to write XP data to the memory cell. In the illustrated example of FIG. 2A, the third threshold voltage distribution 250 represents three bits of data. A first bit of the third threshold voltage distribution 250 corresponds to LP data, a second bit of the third threshold voltage distribution 250 corresponds to UP data, and a third bit of the third threshold voltage distribution 250 corresponds to XP data.

Within the first threshold voltage distribution 210, when a first $V_t$ 212 is set, the example memory cell 185 represents a binary one. When a second $V_t$ 215 is set, the example memory cell 185 represents a binary zero.

When an upper page (UP) of data is written to the example memory cell 185 (e.g., during the transition to the UP write phase represented by the second threshold voltage distribution 220), the $V_t$ value is transitioned from, for example, the first $V_t$ 212 either along transition indicator 213 to a third $V_t$ 221 (representing a binary one-one), or along transition indicator 214 to a fourth $V_t$ 222 (representing a binary zero-one). If the lower page of data were a zero (e.g., the memory cell 185 is set to the second $V_t$ 215), the threshold voltage ($V_t$) value is transitioned from, for example, the second $V_t$ 215 either along transition indicator 216 to a fifth $V_t$ 223 (representing a binary zero-zero), or along transition indicator 217 to a sixth $V_t$ 224 (representing a binary one-zero).

When an extra page of data is written to the example memory cell 185, the example memory cell is transitioned from any of the third $V_t$ 221, the fourth $V_t$ 222, the fifth $V_t$ 223, or the sixth $V_t$ 224, along a respective transition indicator 231, 232, 233, 234, 235, 236, 237, 238 to a seventh $V_t$ 251, an eighth $V_t$ 252, a ninth $V_t$ 253, a tenth $V_t$ 254, an eleventh $V_t$ 255, a twelfth $V_t$ 256, a thirteenth $V_t$ 257, or a fourteenth $V_t$ 258.

In some examples, a write operation may be aborted during a transition between threshold voltage ($V_t$) levels (e.g., along the transition indicator 213, 214, 216, 217, 231, 232, 233, 234, 235, 236, 237, 238). Thus, if the memory cell 185 were transitioning along, for example, the transition indicator 234, the threshold voltage ($V_t$) value of the memory cell 185 may be altered such that the cell no longer properly represents a threshold voltage ($V_t$) value associated with the fourth $V_t$ 222. To account for this possibility, after an abort operation, the $V_t$ value of the memory cell 185 is analyzed at different levels to identify the data that was transitioned away from (e.g., prior data). The prior data may then be re-established using, for example, a modified threshold voltage distribution, to ensure that the prior data is protected from corruption as a result of the power loss event.

In the illustrated example of FIG. 2A, three reference voltages represent boundaries demarking regions within which threshold voltage values are programmed to correspond to particular binary values. In the illustrated example, the three reference (R) values are represented as $R_1$ 271, $R_2$ 272, and $R_3$ 273. The R values 271, 272, 273 represent different threshold voltage ($V_t$) levels of the memory cell 185 that are sensed to read data stored in the memory cell 185 using the second threshold voltage distribution 220. For example, when performing a sense operation at $R_1$ 271, if the threshold voltage ($V_t$) level of the memory cell 185 is less than $R_1$ 271, a binary one is returned. When performing the sense operation at $R_1$ 271, if the threshold voltage ($V_t$) level of the memory cell is greater than or equal to $R_1$ 271, a binary zero is returned. In some examples, different reference voltages are used for each of $R_1$ 271, $R_2$ 272, and $R_3$ 273 to, for example, shift the threshold voltage distributions. Shifting the threshold voltage distribution causes an increase or decrease in threshold voltages ($V_t$) representing binary values. For example, if a threshold voltage ($V_t$) of 2.0 volts represents a binary value of zero-one because it is between a reference voltage (e.g., $R_1$ 271) of 1.8 volts and a reference voltage (e.g., $R_2$ 272) of 2.2 volts, changing $R_1$ 271 to 2.0 volts and $R_2$ 272 to 2.4 volts shifts the threshold voltage ($V_t$) needed to represent a binary value of zero-one to 2.2 volts.

In some examples, prior to performing a sense operation, the appropriate R value(s) used in the sense operation may be determined based on a distribution that is used for a particular cell. For example, if a cell is a 2 bpc MLC cell, the example block controller 170 of FIG. 1 may identify reference voltages associated with reading a 2 bpc memory cell (e.g., $R_1$ 271, $R_2$ 272, $R_3$ 273), to enable reading of a binary value based on the $V_t$ voltage of the memory cell.

FIG. 2A also includes a fourth threshold voltage distribution 290. The example fourth threshold voltage distribution 290 is a modified version of the second threshold voltage distribution 220. The fourth threshold voltage distribution 290 uses modified reference values $R'_1$ 295, $R'_2$ 296, and $R'_3$ 297 to enable the memory cell to store two bits of data per cell. The example fourth threshold voltage distribution 290 includes a fifteenth $V_t$ 291, a sixteenth $V_t$ 292, a seventeenth $V_t$ 293, and an eighteenth $V_t$ 294 that correspond, respectively, to the same represented data as the third $V_t$ 221, the fourth $V_t$ 222, the fifth $V_t$ 223, and the sixth $V_t$ 224. The reference values $R'_1$ 295, $R'_2$ 296, and $R'_3$ 297 are modified as compared to the reference values $R_1$ 271, $R_2$ 272, and $R_3$ 273 to account for increased voltage levels that might have been reached when transitioning from the second threshold voltage distribution 220 to the third threshold voltage distribution 250 (e.g., during the XP write phase).

In the illustrated example of FIG. 2A, three modified reference (R') values, $R'_1$ 295, $R'_2$ 296, and $R'_3$ 297, are shown. The R' values 295, 296, 297 represent different $V_t$ levels of the memory cell 185 that are sensed to recover data that was previously written to the memory cell 185 (e.g., after an abort). In some examples, a write operation may be aborted during the XP write phase (e.g., while transitioning between the second threshold voltage distribution 220 and the third threshold voltage distribution 250). For example, the transition along transition indicator 234 crosses the boundary defined by $R_1$ 271. Thus, if the memory cell 185 were transitioning along, for example, the transition indicator 234, the voltage threshold ($V_t$) value of the memory cell 185 may be altered such that the cell no longer properly represents a voltage threshold ($V_t$) value associated with the fourth $V_t$ 222 using the reference voltages of the second threshold voltage distribution 220 (e.g., $R_1$ 271, $R_2$ 272, $R_3$ 273). To account for this possibility, after an abort operation, the voltage threshold ($V_t$) value of the memory cell 185 is pulsed such that the voltage threshold ($V_t$) value of the memory cell falls within the modified distribution levels of the fourth threshold voltage distribution 290 (e.g., using the reference voltage $R'_1$ 295, $R'_2$ 296, $R'_3$ 297).

In the illustrated example of FIG. 2A, the fifteenth $V_t$ 291 is not increased with respect to the corresponding third $V_t$ 221 because, for example, there is no lower voltage boundary that would cause an incorrect reading of a binary value represented by the fifteenth $V_t$ 291. Moreover, after aborting an XP write operation that would transition from the third $V_t$ 221 to either the seventh $V_t$ 251 or the eighth $V_t$ 252, and subsequently writing to the memory cell using the fourth threshold voltage distribution 290, the example block controller 180, by performing a program verify operation during writing, would immediately determine that the $V_t$ value of the memory cell need not be modified to comply with the being less than the reference voltage $R'_1$ 296.

Figure 2B:
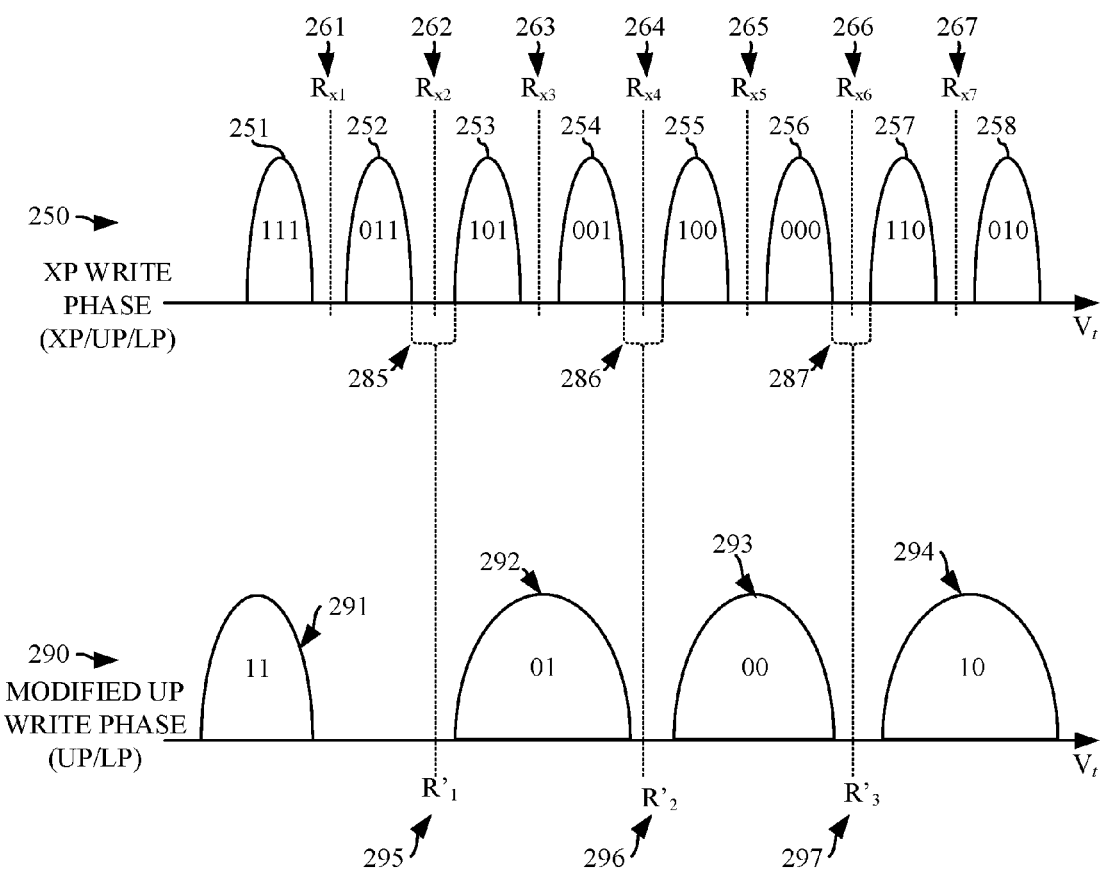

FIG. 2B is a diagram illustrating ranges of reference values that may be used in association with the fourth threshold voltage distribution 290 of FIG. 2A. In the illustrated example of FIG. 2B, reference values $R_{x1}$ 261, $R_{x2}$ 262, $R_{x3}$ 263, $R_{x4}$ 264, $R_{x5}$ 265, $R_{x6}$ 266, $R_{x7}$ 267 are shown to illustrate reference voltages used to distinguish between different voltage threshold ($V_t$) values after completion of the XP write phase. That is, the reference voltages $R_{x1}$ 261, $R_{x2}$ 262, $R_{x3}$ 263, $R_{x4}$ 264, $R_{x5}$ 265, $R_{x6}$ 266, $R_{x7}$ 267 may be used to determine three-bit-per-cell binary value corresponding to the voltage threshold ($V_t$) value of a cell. In the illustrated example of FIG. 2B, $R'_1$ 295 corresponds to a same voltage threshold ($V_t$) value as $R_{x2}$ 262, $R'_2$ 296 corresponds to a same voltage threshold ($V_t$) value as $R_{x4}$ 264, and $R'_3$ 297 corresponds to a same voltage threshold ($V_t$) value as $R_{x6}$ 266.

However, any other reference voltages may be used for $R'_1$ 295, $R'_2$ 296, and $R'_3$ 297. For example, a reference voltage within a first range 285 may be used for the reference voltage $R'_1$ 295, a reference voltage within a second range 286 may be used for the reference voltage $R'_2$ 296, and a reference voltage within a third range 287 may be used for the reference voltage $R'_3$ 297. In the illustrated example, the first range 285 has a lower limit matching the upper edge of the eighth $V_t$ 252, and has an upper limit matching the lower edge of the ninth $V_t$ 253. In the illustrated example, the second range 286 has a lower limit matching the upper edge of the tenth $V_t$ 254, and has an upper limit matching the lower edge of the eleventh $V_t$ 255. In the illustrated example, the third range 287 has a lower limit matching the upper edge of the twelfth $V_t$ 256, and has an upper limit matching the lower edge of the thirteenth $V_t$ 257. However, any other reference voltages may additionally or alternatively be used (e.g., reference voltages outside of the example ranges 285, 286, 287).

As noted above, when writing data to the memory cell 185, the block controller 170 stores the data to be written in the $PDC_0$ 175, the SDC 179, and/or the XDC 181. As portions (e.g., the LP, the UP, the XP, etc.) of the data are written, a corresponding location in the $PDC_0$ 175, the SDC 179, and/or the XDC 181 is/are set to a binary one to represent that the data has been written. However, in some examples, the data to be written is also a binary one. As a consequence, in some examples, it is not possible to rely solely on the $PDC_0$ 175, the SDC 179, and/or the XDC 181 to recover data that was being written to the memory cell 185. For example, if the $PDC_0$ 175 were a binary one, and upon completion of writing the value of the $PDC_0$ 175 to the memory cell the $PDC_0$ 175 was again set to a one, when attempting to determine the original data to be written, it would not be possible to distinguish whether the data was a one or a zero based on the $PDC_0$ 175, because the $PDC_0$ 175 was set to a binary one to indicate that writing of the $PDC_0$ 175 was complete.

In the illustrated example of FIG. 2A, four levels $L_0$ 280, $L_1$ 281, $L_2$ 282, and $L_3$ 283 are shown to represent LP and UP writes. Each level may be considered to be passed or failed. As used herein, a level is failed when the block controller 170 is attempting to pulse the memory cell 185 to reach the particular level, but has not yet met that level. As such, failed levels correspond to the transition indicators 213, 214, 216, 217 that are between the first threshold voltage distribution 210 and the second threshold voltage distribution 220. As used herein, a level is passed when the block controller 170 has already pulsed the memory cell 185 to reach the particular level, and is continuing to pulse the memory cell 185 to write XP data. As such, passed levels correspond to the transition indicators 231, 232, 233, 234,

235, 236, 237, 238 that are between the second threshold voltage distribution 220 and the third threshold voltage distribution 250.

As noted above, reliance on the $PDC_0$ 175, the $PDC_1$ 177, the SDC 179, and/or the XDC 181 alone for recovery of the data to be written might result in data corruption. For example, when transitioning the memory cell 185 from a voltage threshold ($V_t$) level corresponding to the sixth $V_t$ 224 to the fourteenth $V_t$ 258 (e.g., $L_3$ is passed), the data stored in the $PDC_0$ 175 and the SDC 179 is a binary one-one (because the LP and UP writes associated with the sixth $V_t$ 224 have been completed). However, the data that was to be written is actually a binary one-zero. For example, detection of the binary one-zero is performed using a sense operation at $R'_3$ 297, which returns a binary value indicating whether the voltage threshold ($V_t$) level is greater than or equal to $R'_3$ 297 during either the transition associated with transition indicator 237 or transition indicator 238.

While an example manner of implementing the SSD 110 is illustrated in FIG. 1, one or more of the elements, processes and/or devices illustrated in FIG. 1 may be combined, divided, re-arranged, omitted, eliminated and/or implemented in any other way. Further, the example host interface 120, the example power loss detector 140, the example abort instructor 145, the example SSD controller 150, the example buffer 155, and/or more generally, the example memory controller 125, the example block controller 170, and/or more generally the example memory block 130, and/or, more generally, the example SSD 110 of FIG. 1 may be implemented by hardware, software, firmware and/or any combination of hardware, software and/or firmware. Thus, for example, any of the example host interface 120, the example power loss detector 140, the example abort instructor 145, the example SSD controller 150, the example buffer 155, and/or more generally, the example memory controller 125, the example block controller 170, and/or more generally the example memory block 130, and/or, more generally, the example SSD 110 of FIG. 1 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example host interface 120, the example power loss detector 140, the example abort instructor 145, the example SSD controller 150, the example buffer 155, and/or more generally, the example memory controller 125, the example block controller 170, and/or more generally the example memory block 130, and/or, more generally, the example SSD 110 of FIG. 1 is/are hereby expressly defined to include a tangible computer readable storage device or storage disk such as a memory, a digital versatile disk (DVD), a compact disk (CD), a Blu-ray disk, etc. storing the software and/or firmware. Further still, the example SSD 110 of FIG. 1 may include one or more elements, processes and/or devices in addition to, or instead of, those illustrated in FIG. 1, and/or may include more than one of any or all of the illustrated elements, processes and devices.

Flowcharts representative of example machine readable instructions for implementing the example SSD 110 of FIG. 1 is/are shown in FIGS. 3, 4, 5A, 5B, and/or 7. In these example(s), the machine readable instructions comprise a program(s) for execution by a processor such as the processor 812 shown in the example processor platform 800 discussed below in connection with FIG. 8. The program may be embodied in software stored on a tangible computer readable storage medium such as a CD-ROM, a floppy disk, a hard drive, a digital versatile disk (DVD), a Blu-ray disk, or a memory associated with the processor 812, but the entire program and/or parts thereof could alternatively be executed by a device other than the processor 812 and/or embodied in firmware or dedicated hardware. Further, although the example program(s) is/are described with reference to the flowchart(s) illustrated in FIGS. 3, 4, 5A, 5B, and/or 7, many other methods of implementing the example SSD 110 may alternatively be used. For example, the order of execution of the blocks may be changed, and/or some of the blocks described may be changed, eliminated, or combined.

As mentioned above, the example processes of FIGS. 3, 4, 5A, 5B, and/or 7 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 3, 4, 5A, 5B, and/or 7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

Figure 3:
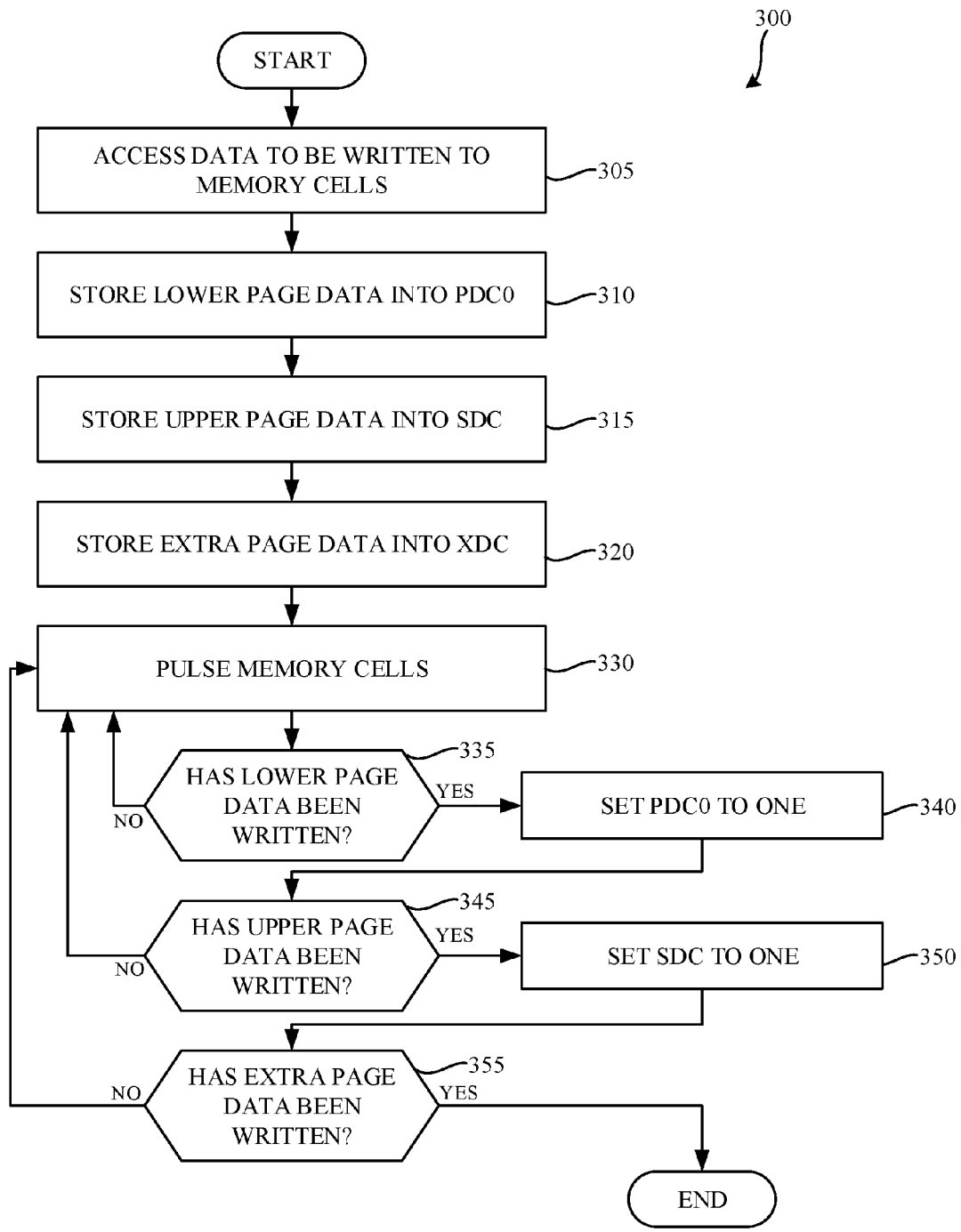
FIG. 3 is a flowchart representative of example machine-readable instructions which, when executed, cause the example solid state drive of FIG. 1 to write data to the example memory cells of FIG. 1.

FIG. 3 is a flowchart representative of example machine-readable instructions 300 which, when executed, cause the example SSD 110 of FIG. 1 to write data to the example memory cell 185 of FIG. 1. The example process begins when the block controller 170 (FIG. 1) accesses data to be written to the memory cell 185. (Block 305). In the illustrated example, the block controller 170 accesses the data by receiving an instruction via the bus 131 (FIG. 1). The example block controller 170 stores the LP data to be written in the $PDC_0$ 175 (FIG. 1). (Block 310). For example, the LP data is the first bit of the data received at Block 305. The example block controller 170 stores the UP data to be written in the SDC 179 (FIG. 1). (Block 315). For example, the UP data is a second bit of the data received at Block 305. The example block controller 170 stores the XP data to be written in the XDC 181 (FIG. 1). (Block 320). For example, the XP data is a third but of the data received at Block 305.

The block controller 170 applies a charge (e.g., a pulse) to the memory cell 185 to write the data stored in the $PDC_0$ 175, the SDC 179, and the XDC 181 to the memory cell 185. (Block 330). In examples disclosed herein, the pulse increases the $V_t$ value of the memory cell 185. In some examples, the memory cell 185 is erased or changed by reducing the voltage threshold ($V_t$) of the memory cell 185 to write a value to the memory cell 185 by decreasing its voltage threshold ($V_t$) from a higher voltage value to a relatively lower voltage value. The block controller 170 determines if the pulse resulted in the LP data being written to the memory cell 185. (Block 335). In some examples, the block controller 170 determines that the LP data is written by performing a sense operation on the memory cell 185 (e.g., a sense operation at the example $R_2$ 272 of FIG. 2A, a sense operation at the example $R_1$ 271 of FIG. 2A) to determine whether the LP data has been written. For example, the sense operation may be used to determine whether a voltage threshold ($V_t$) value of the memory cell 185 has been reached such that, when read at a later time, the voltage threshold ($V_t$) value will properly indicate the data to be written.

In some examples, multiple pulses may be necessary to set the voltage threshold ($V_t$) of the memory cell 185 to the appropriate level. For example, each pulse may represent a small, incremental, change of the voltage threshold ($V_t$) level of the memory cell 185, such that multiple pulses may be used to increase the voltage threshold ($V_t$) level to the appropriate level. If the LP data has not been written (Block 335 returns a result of NO), the example block controller 170 continues to pulse the memory cell 185 (Block 330) until the LP data has been written (Block 335 returns a result of YES). When the LP data has been written to the memory cell 185, (Block 335 returns a result of YES) the block controller 170 sets the $PDC_0$ 175 to a binary one. For example, setting the PDC0 to a binary one indicates that the data stored in the $PDC_0$ 175 has already been written.

The block controller 170 then determines whether the UP data has been written. (Block 345). In some examples, the block controller 170 determines that the UP data is written by performing one or more sense operations on the memory cell 185 to ascertain the voltage threshold ($V_t$) value of the memory cell 185. If the UP data has not been written (Block 345 returns a result of NO), the block controller 170 continues to pulse the memory cell (Block 330). In the illustrated example of FIG. 3, after each pulse of the memory cell 185 in response to determining that the UP data has not been written at block 345, the block controller 170 re-verifies that the LP data has been written (Block 335). In some examples, the re-verification may include a check of the $PDC_0$ 175 to determine that a binary one is stored in the $PDC_0$ 175. However, in some examples, the re-verification may include performing a sense operation of the memory cell 185 to determine whether the voltage threshold ($V_t$) value, when read at a later time, will result in the appropriate binary value being read. In some examples, such re-verification may be omitted. If the block controller 170 determines that the UP data has been written (Block 345 returns a result of YES), the block controller 170 sets the SDC 179 to a binary one. (Block 350).

The block controller 170 then determines whether the XP data has been written. (Block 345). In some examples, the block controller 170 determines that the XP data is written by performing one or more sense operations on the memory cell 185 to ascertain the $V_t$ value of the memory cell 185. If the XP data has not been written (Block 355 returns a result of NO), the block controller 170 continues to pulse the memory cell 185 (Block 330). In the illustrated example of FIG. 3, after each pulse of the memory cell 185 in response to determining that the XP data has not been written at Block 355, the block controller 170 re-verifies that the LP data has been written (Block 335) and that the UP data has been written (Block 345). However, in some examples, such re-verification may be omitted. If the block controller 170 determines that the XP data has been written (Block 355 returns a result of YES), then the received data has been written to the memory cell 185, and the example process of FIG. 3 terminates.

Figure 4:
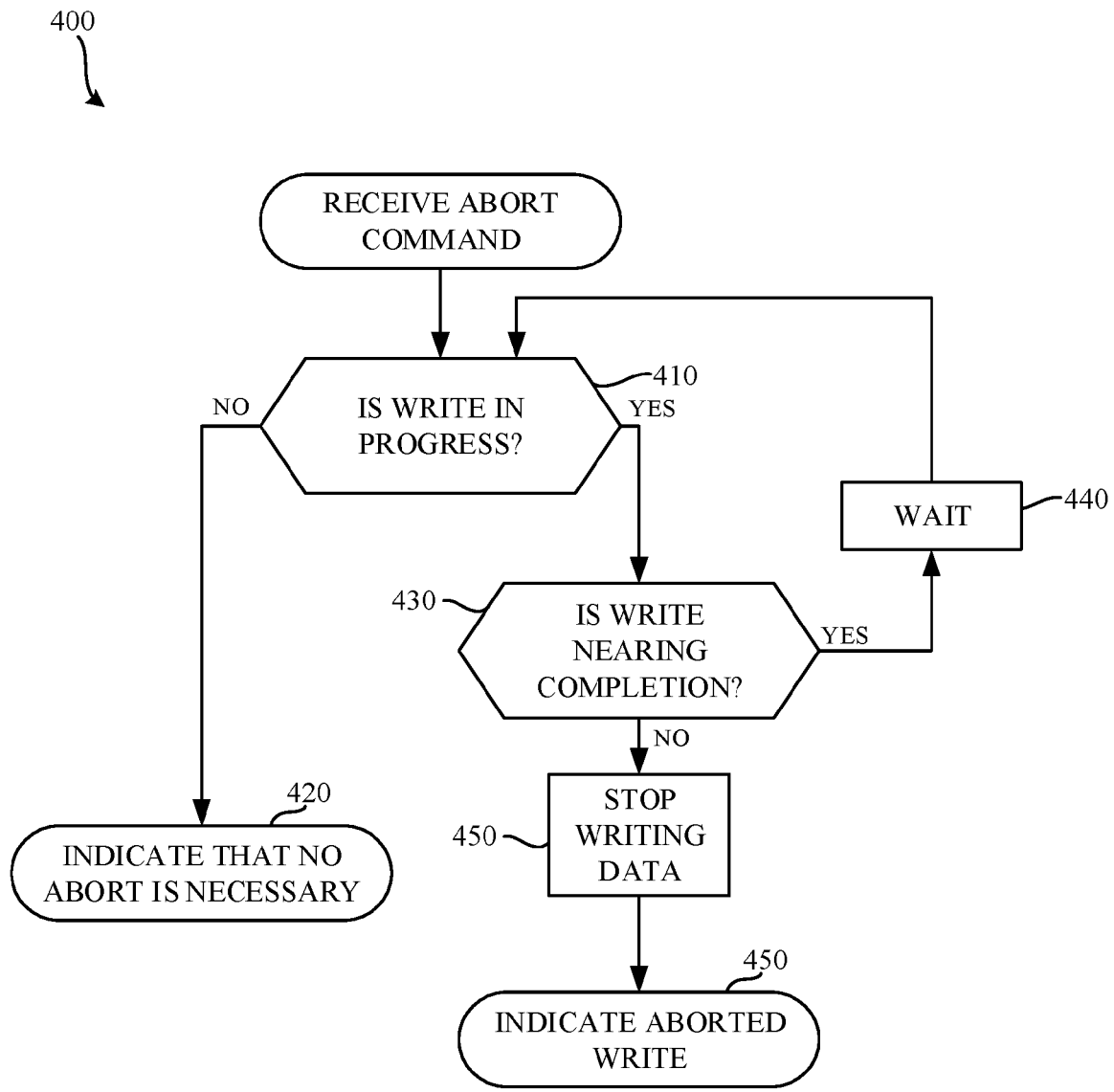
FIG. 4 is a flowchart representative of example machine-readable instructions which, when executed, cause the example solid state drive of FIG. 1 to abort writing data to the example memory cells of FIG. 1.

FIG. 4 is a flowchart representative of example machine-readable instructions 400 which, when executed, cause the example SSD 110 of FIG. 1 to abort writing data to the example memory cell 185 of FIG. 1. As disclosed below in connection with FIG. 5A, upon detection of a power loss event, the example abort instructor 145 (FIG. 1) transmits an abort command to the block controller 170. The abort command may be received by the block controller 170 at any point during a write operation. In the illustrated example of FIG. 4, the example block controller 170 determines, upon receipt of an abort command, whether a write operation is in progress. (Block 410). In some examples, the example block controller 170 determines whether a particular type of write (e.g., an XP write, a UP write) is in progress. That is, in some examples, ongoing writes are aborted only if they write operations that are expected to take a longer amount of time to complete. If no write operation is in progress (Block 410 returns a result of NO), the example block controller 170 indicates that no abort is necessary. (Block 420). In some examples, the example block controller 171 communicates to the memory controller 125 that no abort was necessary for a particular write via the bus 131. If an abort is necessary (Block 420), the example process of FIG. 4 ends.

If a write is in progress (Block 410 returns a result of YES), the block controller 170 determines whether the ongoing write is nearing completion. (Block 430). In the illustrated example, the block controller 170 determines whether the ongoing write is nearing completion by, for example, comparing a number of pulses applied to the memory cell 185 during writing operations (e.g., a number of times that Block 330 of FIG. 3 has been executed) to a threshold. In some examples, the threshold is a user-defined threshold number. If, for example, a write operation that takes five thousand micro seconds to complete is nearing completion (e.g., less than five hundred micro seconds remaining), it is more efficient to complete the ongoing write operation than to halt the operation and perform the recovery operation(s) disclosed in connection with FIGS. 5 and/or 7 (which may take an additional three thousand micro seconds to complete). If the write operation is nearing completion (Block 430 returns a result of YES), the example block controller 170 waits (Block 440), and then re-determines whether the write operation is still in progress (Block 410). In the illustrated example of FIG. 4, the wait operation causes the block controller 170 to wait for fifty micro seconds. However, any other wait duration may additionally or alternatively be used. The example block controller 170 then re-evaluates whether the write is in progress. (Block 410).

If the write operation is not nearing completion (Block 430 returns a result of NO), the example block controller 170 halts the ongoing write operation. (Block 450). The block controller 170 then provides an indication that the write operation was aborted. (Block 450). In examples disclosed herein, the indication of the aborted write operation is conveyed by the use of a status bit that is communicated to the memory controller 125 using the bus 131. When the write operation has been aborted (Block 450), the example process of FIG. 4 ends.

In some examples, blocks 430 and 440 of FIG. 4 are omitted. As such, in some examples, rather than determining whether a write operation in progress is nearing completion, upon determining that a write is in progress (Block 410 returns a result of YES), the example block controller 170 may directly proceed to stop writing any further data. (Block 450).

Figure 5A:
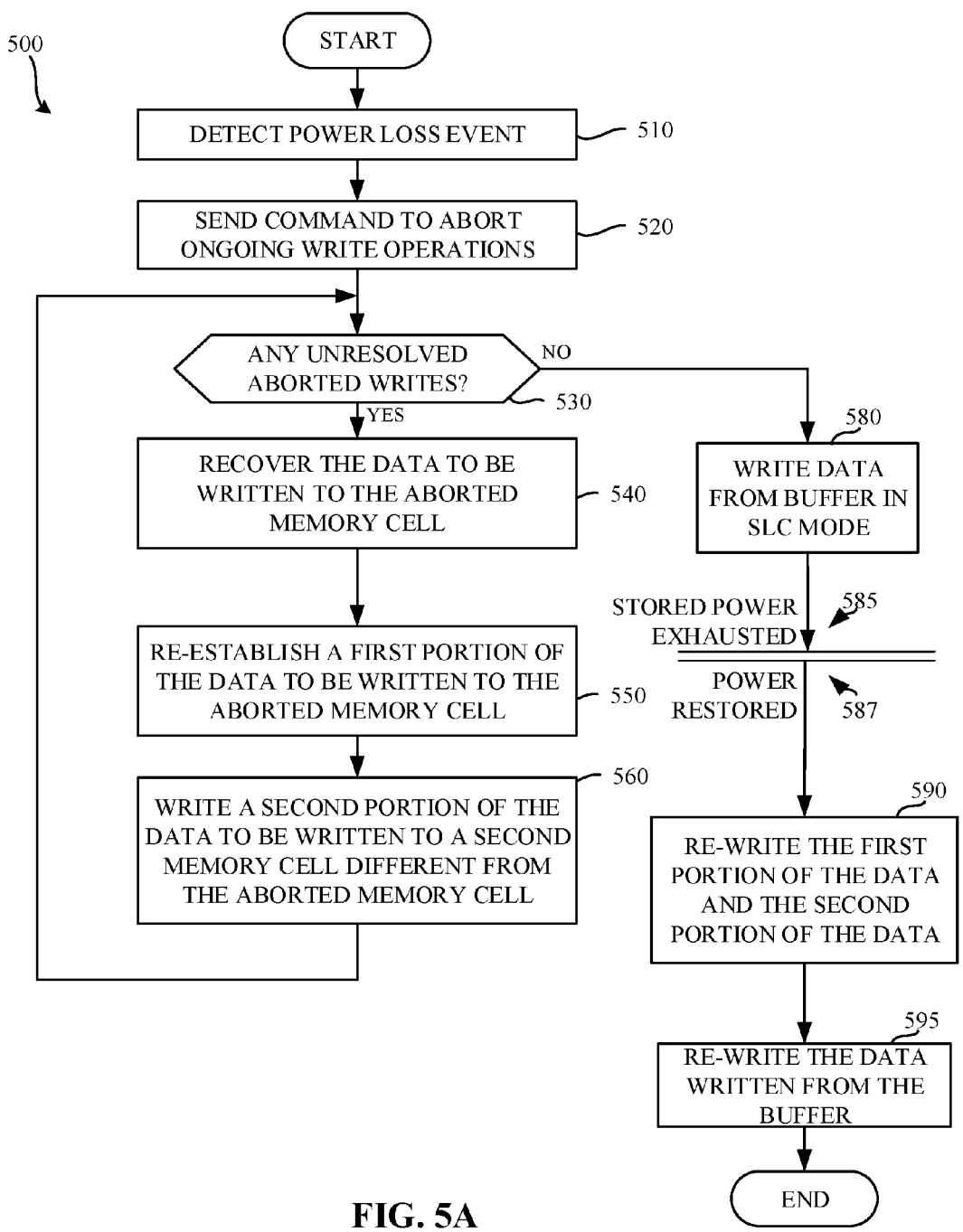
FIG. 5A is a flowchart representative of example machine-readable instructions which, when executed, cause the example solid state drive of FIG. 1 to preserve data of the solid state drive during a power loss event.

FIG. 5A is a flowchart representative of example machine-readable instructions 500 which, when executed, cause the example SSD 110 of FIG. 1 to reduce a power requirement of the SSD 110 during a power loss event by shortening an amount of time and/or energy required to perform a data protection and/or recovery operation. The example program 500 of FIG. 5A begins when the power loss detector 140 (FIG. 1) detects the power loss event. (Block 510). In examples disclosed herein, the example power loss detector detects the power loss event by monitoring a power input received via the host interface 120. However, any other approach to detecting the power loss event may additionally or alternatively be used.

The example abort instructor 145 sends a command to abort any ongoing write operations. (Block 520). In examples disclosed herein, the command is sent via the bus 131 (FIG. 1) to the block controller 170 (FIG. 1). In the illustrated example, the command is broadcast over the bus 131 such that any memory block 130, 133 will receive the abort command. However, any approach may additionally or alternatively be used such as, for example, setting a Write Protect (WP) bit associated with the block controller 170. As disclosed in connection with FIG. 4, each memory block 130, 133 and/or the block controller associated with that memory block 130, 133 processes the abort command with respect to each memory cell 185 within the respective memory block 130, 133.

The example SSD controller 150 (FIG. 1) determines whether there are any unresolved aborted writes remaining to be processed. (Block 530). In the illustrated example of FIG. 5A, the example SSD controller 150 accesses a status bit associated with each memory block 130, 133 (and/or block controller associated therewith) to determine if a write was aborted in association with the memory block 130, 133. If a write was aborted, the example SSD controller 150 interacts with the block controller 170 to recover the data to be written to the aborted memory cell. (Block 540). In some examples, the SSD controller 150 interacts with the block controller 170 to recover the data to be written to the aborted cell by reading the data to be written from one or more of the $PDC_0$ 175, the $PDC_1$ 177, the SDC 179, and/or the XDC 181. In some examples, the SSD controller 150 interacts with the block controller 170 to sense a voltage threshold ($V_t$) value of the memory cell 185. An example approach to recovering the data to be written to the aborted memory cell is disclosed in connection with the illustrated examples of FIGS. 6 and/or 7. In some examples, the memory block 170 includes a page buffer that stores one or more of the LP data, the UP data, and/or the XP data without modifying such buffer during write operations. In such an example, the example SSD controller 150 may interact with the block controller 170 to recover the data to be written to the aborted memory cell from the page buffer.

The example SSD controller 150 causes the block controller 170 to re-establish a first portion of the data to be written to the aborted memory cell using a modified threshold voltage distribution (e.g., the fourth threshold voltage distribution 290 of FIG. 2A). (Block 550). Because the $V_t$ level of the memory cell may have shifted prior to the abort (e.g., after the block controller had completed writing UP data but had not yet completed writing XP data), re-establishing the first portion of the data to the aborted memory cell using the modified threshold voltage distribution protects the first portion of the data to be written. In example disclosed herein, the first portion of the data is re-established in the aborted memory cell using reference voltages corresponding to the modified $V_t$ distribution (e.g., $R'_1$ 295, $R'_2$ 296, $R'_3$ 297). In examples disclosed herein, the reference voltages corresponding to the modified Vt distribution are used because, for example, the aborted cell may have been in the process of writing XP data and may have transitioned outside of a prior boundary (e.g., $R_1$ 271, $R_2$ 272, $R_3$ 273) that would result in an incorrect reading.

The SSD controller 150 causes the block controller 170 to write a second portion of the data to be written to a second memory cell different from the aborted memory cell. (Block 560). In the illustrated example of FIG. 5A, the second memory cell is included in the same memory block as the aborted memory cell. However, in some examples, the second memory cell may be included in a memory block other than the memory block that includes the aborted memory cell. For example, the second memory cell may be included in a memory block that is operated a dedicated SLC mode.

In examples disclosed herein, the first portion of the data to be written corresponds to a lower page (LP) and an upper page (UP) of the data to be written, while the second portion of the data to be written corresponds to an extra page (XP) of the data to be written. As noted above, the first portion of the data to be written is re-written to the aborted memory cell. (Block 550). When writing the second portion of the data to the memory cell different from the aborted memory cell, the block controller 170 writes the second portion of the data to be written as LP data (e.g., the data is written in an SLC mode). Writing the second portion of the data as LP data ensures that the write is completed more quickly than if the second portion of the data were written as XP data to the aborted memory cell.

While in the illustrated example of FIG. 5A the first portion corresponds to LP and UP data, and the second portion corresponds to XP data, the data to be written may be segmented in any other fashion. For example, the first portion may correspond to the LP data and the second portion may correspond to the UP data. As such, in some examples, the UP data is written in an SLC mode to the memory cell different from the aborted memory cell.

In some examples, a third portion of the data to be written may be identified that corresponds to the XP portion of the data to be written. In such examples, the first portion of the data (e.g., the LP data) may be re-written to the aborted memory cell, the second portion of the data (e.g., the UP data) may be written to a second memory cell different from the aborted memory cell, and the third portion of the data (e.g., the XP data) may be written to a third memory cell different from both the aborted memory cell and the second memory cell. In such examples, each of the LP data, UP data, and XP data may be written in an SLC mode (e.g., storing a single bit of information per memory cell) to further reduce an amount of time and/or energy spent writing the data.

When all unresolved aborted writes are processed (Block 530 returns a result of NO), the example SSD controller 150 transmits any remaining data stored in the buffer 155 to the memory block 130 for writing. (Block 580). In examples disclosed herein, the remaining data is written using an SLC mode. Writing using the SLC mode enables the buffer 155 to be programmed more quickly than if the data were written in another mode (e.g., an 2 bpc MLC mode, a TLC mode, etc.). Writing data more quickly in the illustrated example is useful to reduce the amount of time needed to write the data to non-volatile memory (e.g., the memory block 130, 133). In sum, all data that was in process of being written is written in a non-volatile manner (e.g., Blocks 540-560), and any data buffered but not yet sent for writing is also written in a non-volatile manner, such that the SSD 110 will not become corrupt as a result of the power loss event. The example solid state drive 110 then, having protected all data that had been received at the SSD 110 and having exhausted the energy stored in the energy storage circuitry 132, loses power. (Line 585).

Upon restoration of the power to the SSD 110 (line 587), the example memory controller 125 causes the first portion of the data and the second portion of the data to re-written. (Block 590). In examples disclosed herein, the first portion of the data and the second portion of the data are re-written to a memory cell different from the aborted memory cell. In examples disclosed herein, the first portion of the data and the second portion of the data are re-written to the memory cell different from the aborted memory cell because the first portion of the data was previously written to the aborted memory cell using the modified $V_t$ distribution (e.g., the fourth threshold voltage distribution 290 of FIG. 2A). Transitioning from the modified $V_t$ distribution (e.g., the fourth threshold voltage distribution 290 of FIG. 2A) to the TLC $V_t$ distribution (e.g., the third threshold voltage distribution 250 of FIG. 2A) might involve erasing the memory cell prior to writing the data because write operations are not used to decrease $V_t$ values of memory cells. However, in some examples, the first portion of the data and the second portion of the data may be written to the aborted memory cell which may, for example, involve first erasing the memory cell.

The example memory controller re-writes the data that was written from the buffer. (Block 595). In examples disclosed herein, prior to exhausting the energy stored in the energy storage circuitry 132 (e.g., prior to line 585), the data from the buffer 155 was written to memory operated in an SLC mode (e.g., block 580). In examples disclosed herein, the memory that was written from the buffer 155 is re-written to a memory location that is operated in a multi-level mode (e.g., 2 bpc MLC mode, TLC mode, QLC mode, etc.). Re-writing the data from memory operated in the SLC mode to memory operated in the multi-level mode results in a greater data storage density, as well as freeing up the SLC mode memory to be used in the event of a subsequent power loss event.

Figure 5B:
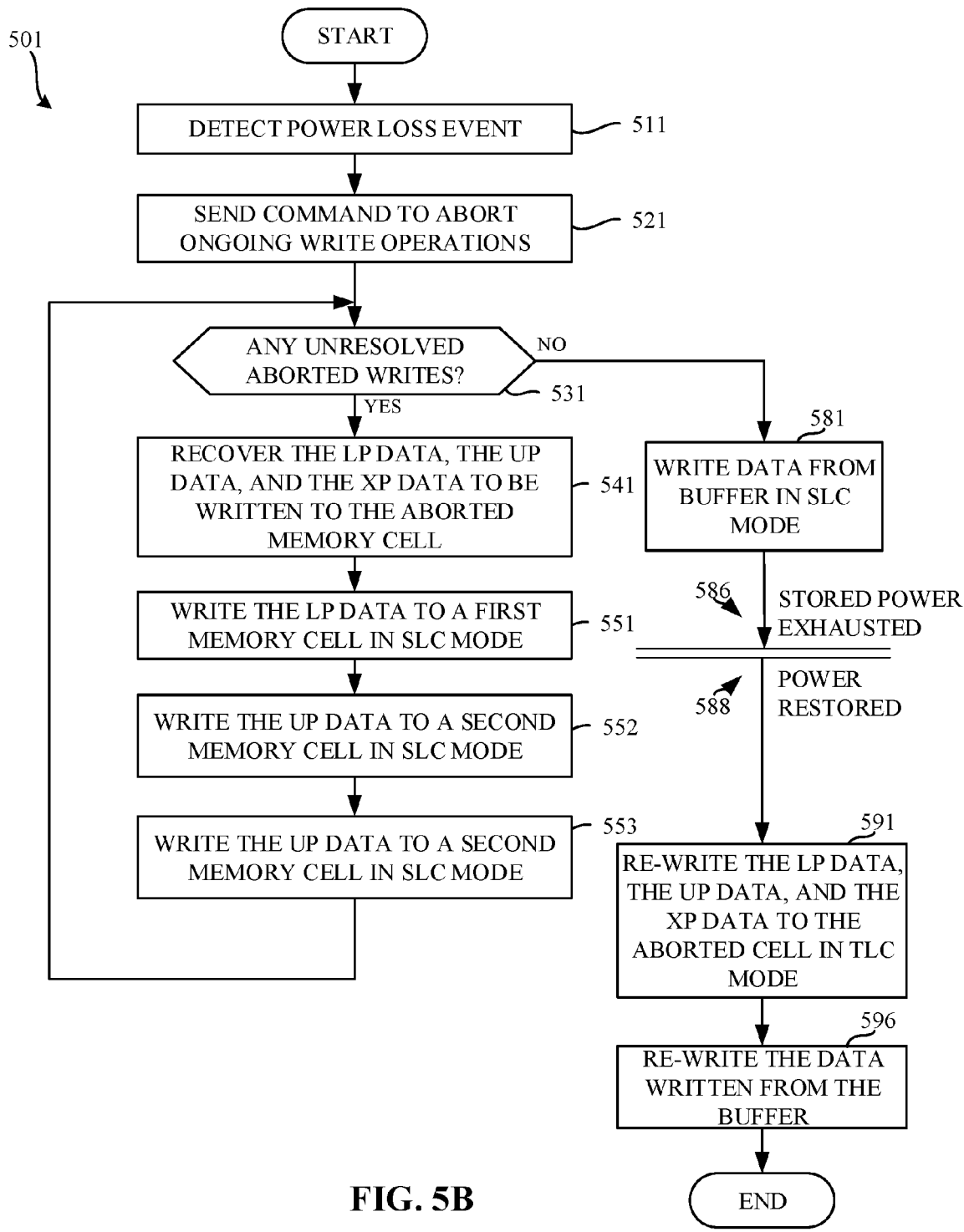
FIG. 5B is a flowchart representative of alternative example machine-readable instructions which, when executed, cause the example solid state drive of FIG. 1 to preserve data of the solid state drive during a power loss event.

FIG. 5B is a flowchart representative of example alternative machine-readable instructions 501 which, when executed, cause the example SSD 110 of FIG. 1 to reduce a power requirement of the SSD 110 during a power loss event by shortening an amount of time and/or energy required to perform a data protection and/or recovery operation. The example program 501 of FIG. 5B begins when the power loss detector 140 (FIG. 1) detects the power loss event. (Block 511). In examples disclosed herein, the example power loss detector detects the power loss event by monitoring a power input received via the host interface 120. However, any other approach to detecting the power loss event may additionally or alternatively be used.

The example abort instructor 145 sends a command to abort any ongoing write operations. (Block 521). In examples disclosed herein, the command is sent via the bus 131 (FIG. 1) to the block controller 170 (FIG. 1). In the illustrated example, the command is broadcast over the bus 131 such that any memory block 130, 133 will receive the abort command. However, any approach may additionally or alternatively be used such as, for example, setting a Write Protect (WP) bit associated with the block controller 170. In examples disclosed herein, the example write abort command of block 521 of FIG. 5B causes the example block controller 170 to abort any ongoing write operations, regardless of whether the ongoing write operations are nearing completion. Alternatively, in some examples, ongoing write operations that are nearing completion may be allowed to complete. However, allowing ongoing write operations to complete will increase power requirements of the SSD 110 during a power loss event. As such, decreasing the number of ongoing writes or aborting all ongoing writes decreases the power requirements of the SSD 110 during the power loss event.

The example SSD controller 150 (FIG. 1) determines whether there are any unresolved aborted writes remaining to be processed. (Block 531). In the illustrated example of FIG. 5B, the example SSD controller 150 accesses a status bit associated with each memory block 130, 133 (and/or block controller associated therewith) to determine if a write was aborted in association with the memory block 130, 133. If a write was aborted, the example SSD controller 150 interacts with the block controller 170 to recover the LP data, the UP data, and the XP data that was in process of being written to the aborted memory cell. (Block 541). In examples disclosed herein, the LP data and/or UP data are recovered without respect to whether the LP portion and/or UP portion of the aborted write operation had completed. However, in some examples, only data that has not yet completed writing may be recovered. For example, if the example SSD controller 150 determines that the LP portion of the aborted write was completed, the example SSD controller 150 may only recover the UP data and/or XP data. In some examples, the SSD controller 150 interacts with the block controller 170 to recover the data to be written to the aborted cell by reading the data to be written from one or more of the $PDC_0$ 175, the $PDC_1$ 177, the SDC 179, and/or the XDC 181. In some examples, the SSD controller 150 interacts with the block controller 170 to sense a voltage threshold ($V_t$) value of the memory cell 185. An example approach to recovering the data to be written to the aborted memory cell is disclosed in connection with the illustrated examples of FIGS. 6 and/or 7. In some examples, the memory block 170 includes a page buffer that stores one or more of the LP data, the UP data, and/or the XP data without modifying such buffer during write operations. In such an example, the example SSD controller 150 may interact with the block controller 170 to recover the data to be written to the aborted memory cell from the page buffer.

The example SSD controller 150 causes the LP data to be written to a first memory cell operated in a dedicated SLC mode. (Block 551). In examples disclosed herein, the first memory cell is different from the aborted memory cell. In some examples, the first memory cell is included in a same memory block as the aborted memory cell. However, in some examples, the aborted memory cell is included in a first memory block (e.g., the memory block 130 of FIG. 1), and the first memory cell is included in a second memory block (e.g., the memory block 133 of FIG. 1) separate from the first memory block. In examples disclosed herein, the first memory block (e.g., the memory block including the aborted memory cell) is operated in a 2 bpc MLC mode. However, the example first memory cell may be operated in any other multi-level mode such as, for example, a TLC mode, a QLC mode, etc. In examples disclosed herein, the second memory block (e.g., the memory block including the first memory cell) is operated in a dedicated SLC mode. As such, in examples disclosed herein, the first portion of the data is written to the first memory cell using the dedicated SLC mode. As used herein, the dedicated SLC mode is a mode of operation of an SLC cell where only a single bit of data is be stored. That is, a memory cell operating in the dedicated SLC cell mode cannot be altered and/or re-programmed to operate in a higher density (e.g., multiple bit per cell) mode. However, in some examples, a lower density mode of an MLC cell (e.g., a mode in which an MLC cell stores a single bit of data per cell) may be used.

The example SSD controller 150 causes the UP data to be written to a second memory cell different from both the aborted memory cell and the first memory cell. (Block 552). In examples disclosed herein, the second memory cell is included in the second memory block (e.g., the same memory block as the first memory cell). However, in some examples, the second memory cell may be included in a third memory block different from the first memory block and the second memory block. In examples disclosed herein, the example second memory cell is operated in the dedicated SLC mode. However, the example second memory cell may be operated in any other mode.

The example SSD controller 150 causes the XP data to be written to a third memory cell different from each of the aborted memory cell, the first memory cell, and the second memory cell. (Block 553). In examples disclosed herein, the third memory cell is included in the second memory block (e.g., the same memory block as the first memory cell and the second memory cell). However, in some examples, the third memory cell may be included in a fourth memory block different from the first memory block, the second memory block, and/or the third memory block. In examples disclosed herein, the example third memory cell is operated in the dedicated SLC mode. However, the example third memory cell may be operated in any other mode.

The example of FIG. 5B does not modify the state of the aborted memory cell(s). Not modifying the aborted cell but, instead, writing the aborted data to different memory cells (e.g., memory cells operated in the dedicated SLC mode) is more time and/or energy efficient because, for example, the amount of time required to complete a TLC write is greater than the amount of time required to abort the TLC write and write the data to three memory cells operated in the dedicated SLC mode. Moreover, not modifying the aborted cell reduces an amount of time and/or energy associated with preserving the data because, for example, the aborted cell need not be pulsed to shift the cell to a known distribution to protect already-written data. In examples disclosed herein, the different memory cells are memory cells that are reserved for use during power loss events. That is, during normal operation of the SSD, the memory cells where data is written in the event of a power loss are not used to store data. Reserving memory cells for use during power loss events ensures that such memory cells will be available should a power loss event be detected.

When all unresolved aborted writes are processed (Block 531 returns a result of NO), the example SSD controller 150 sends any remaining data stored in the buffer 155 to the memory block 130 for writing. (Block 581). In examples disclosed herein, the remaining data is written using an SLC mode. Writing using the SLC mode enables the buffer 155 to be cleared faster than if the data were written in another mode (e.g., a 2 bpc MLC mode, a TLC mode, etc.). Writing data faster in the illustrated example is useful to reduce the amount of time and/or energy needed to write the data to non-volatile memory (e.g., the memory block 130, 133). In sum, all data that was in process of being written is written in a non-volatile manner (e.g., Blocks 541-553), and any data buffered but not yet sent for writing (e.g., data that may have been early-acknowledged to the host) is also written in a non-volatile manner (e.g., Block 581), such that the SSD 110 will not become corrupt as a result of the power loss event. The example solid state drive 110 then, having protected all data that had been received at the SSD 110 and having exhausted the stored energy of the energy storage circuitry 132, loses power. (Line 586). Upon restoration of the power to the SSD 110 (Line 588), the example memory controller 125 causes the LP data, the UP data, and the XP data to be re-written to the aborted memory cell. (Block 591). In some examples, because the threshold voltage ($V_t$) of the aborted memory cell had not been changed, the writing of the LP data, the UP data, and the XP data to the aborted memory cell may involve resuming the aborted write operation from the threshold voltage ($V_t$) value at which the aborted write operation was at when the write was aborted. However, in some examples, the LP data, the UP data, and the XP data may be written to any other location.

The example memory controller re-writes the data that was written from the buffer 155. (Block 596). In examples disclosed herein, prior to exhausting the energy stored in the energy storage circuitry 132 (e.g., prior to line 586), the data from the buffer 155 was written to memory operated in an SLC mode (e.g., block 581). In examples disclosed herein, the memory that was written from the buffer 155 is re-written to a memory location that is operated in a multi-level mode (e.g., 2 bpc MLC mode, TLC mode, QLC mode, etc.). Re-writing the data from memory operated in the SLC mode to memory operated in the multi-level mode results in a greater data storage density, as well as freeing up the SLC mode memory to be used in the event of a subsequent power loss event.

FIG. 6 is a table of data representing various states of memory during the example recovery operation of Block 540. An example processes that may be used to implement the example recovery operation of Block 540 is disclosed in connection with FIG. 7. The example table of data of FIG. 6 is represented using four table sections 601, 602, 603, 604. Each table section 601, 602, 603, 604 includes rows 605, 606, 607, 608, 609, 610, 611 representing stages of progress in a write operation. An SDC column 617 represents the state of the SDC 179 (FIG. 1) at the beginning of the recovery operation (e.g., the example recovery operation of Block 540 of FIG. 5A, the example recovery operation of Block 541 of FIG. 5B), along the various stages of the write operation represented by the rows 605, 606, 607, 608, 609, 610, 611. A $PDC_0$ column 618 represents the state of the $PDC_0$ 175 (FIG. 1) at the beginning of the recovery operation (e.g., the example recovery operation of Block 540 of FIG. 5A, the example recovery operation of Block 541 of FIG. 5B), along the various stages of the write operation represented by the rows 605, 606, 607, 608, 609, 610, 611.

The $L_0$ row 605 of the illustrated example represents that the data to be written corresponds to an $L_0$ state. The example $L_0$ row 605 of the illustrated example corresponds to the level zero $L_0$ 221 of FIG. 2A. The data to be written for the $L_0$ state is a binary one-one. The data stored in the $PDC_0$ 175 both before and after writing to the memory cell 185 is a binary one, and the data stored in the SDC 179 both before and after writing to the memory cell 185 is a binary one.

An $L_1$ pass row 606 of the illustrated example represents that the memory cell 185 has reached the $L_1$ state during writing. The $L_1$ fail row 609 of the illustrated example represents that the memory cell 185 has not yet completed writing the $L_1$ state. The data to be written for the $L_1$ state is a binary zero-one. The data stored in the $PDC_0$ 175 both before writing and after writing to the memory cell 185 is a binary one. The data stored in the SDC 179 before writing to the $L_1$ state is a binary zero, and the data stored in the SDC 179 after writing to the $L_1$ state is a binary one. Consequently, recovery of the data to be written from the SDC 179 may be inaccurate if, for example, the $L_1$ level has been passed (row 606) (e.g., the memory cell 185 is being transitioned along transition indicator 233 or transition indicator 234 of FIG. 2A).

An $L_2$ pass row 607 of the illustrated example represents that the memory cell 185 has reached the $L_2$ state during writing. The $L_2$ fail row 610 of the illustrated example represents that the memory cell 185 has not yet completed writing the $L_2$ state. The data to be written for the $L_2$ state is a binary zero-zero. The data stored in the $PDC_0$ 175 before writing to the $L_2$ state is a binary zero, and the data stored in the $PDC_0$ after writing to the $L_2$ state is a binary one. The data stored in the SDC 179 before writing to the $L_2$ state is a binary zero, and the data stored in the SDC 179 after writing to the $L_2$ state is a binary one. Consequently, recovery of the data to be written from the SDC 179 and/or $PDC_0$ 175 may be inaccurate if, for example, the $L_2$ level has been passed (row 607) (e.g., the memory cell 185 is being transitioned along transition indicator 235 or transition indicator 236 of FIG. 2A).

An $L_3$ pass row 608 of the illustrated example represents that the memory cell 185 has reached the $L_3$ state during writing. The $L_3$ fail row 611 of the illustrated example represents that the memory cell 185 has not yet completed writing the $L_3$ state. The data to be written for the $L_3$ state is a binary one-zero. The data stored in the $PDC_0$ 175 before writing to the $L_3$ state is a binary zero, and the data stored in the $PDC_0$ after writing to the $L_3$ state is a binary one. The data stored in the SDC 179 before writing to the $L_3$ state is a binary one, and the data stored in the SDC 179 after writing to the $L_3$ state is a binary one. Consequently, recovery of the data to be written from the $PDC_0$ 175 may be inaccurate if, for example, the $L_3$ level has been passed (row 608) (e.g., the memory cell 185 is being transitioned along transition indicator 237 or transition indicator 238 of FIG. 2A).

A first table section 601 of the illustrated example represents a first phase of recovery operations performed to recover data from a memory cell that has passed the third level $L_3$ (e.g., the third level $L_3$ 283 of FIG. 2A). With respect to the illustrated example of FIG. 2A, if a memory cell has passed $L_3$, the memory cell may be in the process of transitioning along transition indicator 237 and/or transition indicator 238. In the illustrated example of FIG. 6, four operations represented by a first column 620, a second column 625, a third column 630, and a fourth column 635 are performed to recover the data to be written when the memory cell has passed the third level $L_3$. However, any other number and/or type of operations may additionally or alternatively be performed. The operations of the first column 620, the second column 625, the third column 630, and the fourth column 635 are described in further detail in connection with a first phase 701 of FIG. 7.

A second table section 602 of the illustrated example represents a second phase of recovery operations performed to recover the upper page (UP) of the data to be written to the memory cell 185. An SDC column 637 of the illustrated example represents a state of the SDC 179 after performance of the operations associated with the first table section 601 (i.e., the operations of column 620, column 635, column 630, and column 635). A $PDC_0$ column 638 of the illustrated example represents a state of the $PDC_0$ 175 after performance of the operations associated with the first table section 601 (i.e., the operations of the first column 620, the second column 635, the third column 630, and the fourth column 635). In the illustrated example of FIG. 6, five operations represented by a fifth column 640, a sixth column 645, a seventh column 650, an eighth column 655, and a ninth column 660 are performed to recover the UP of the data to be written to the memory cell 185. However, any other number and/or type of operations may additionally or alternatively be performed. The operations of the fifth column 640, the sixth column 645, the seventh column 650, the eighth column 655, and the ninth column 660 are described in further detail in connection with a second phase 702 of FIG. 7.

A third table section 603 of the illustrated example represents a third phase of recovery operations performed to recover the lower page (LP) of the data to be written to the memory cell 185. An SDC column 667 of the illustrated example represents a state of the SDC 179 after performance of the operations associated with the second table section 602 (i.e., the operations of the fifth column 640, the sixth column 645, the seventh column 650, the eighth column 655, and the ninth column 660). A $PDC_0$ column 668 of the illustrated example represents a state of the $PDC_0$ 175 after performance of the operations associated with the second table section 602 (i.e., the operations of the fifth column 640, the sixth column 645, the seventh column 650, the eighth column 655, and the ninth column 660). In the illustrated example of FIG. 6, two operations represented by a tenth column 670 and an eleventh column 675 are performed to recover the LP of the data to be written to the memory cell 185. However, any other number and/or type of operations may additionally or alternatively be performed. The operations of the tenth column 670 and the eleventh column 675 are described in further detail in connection with a third phase 703 of FIG. 7.

A fourth table section 604 of the illustrated example represents a final state of the $PDC_0$ 175 and the SDC 179 after performance of the operations associated with the first table section 601, the second table section 602, and the third table section 603. As shown in the illustrated example of FIG. 6, as a result of the operations of FIG. 3, the $PDC_0$ 175 and the SDC 179 at the beginning of the procedure for rows $L_1$ pass 605, $L_2$ pass 606, and $L_3$ pass 607 (the SDC column 617, the $PDC_0$ column 618 of the first table section 601) does not represent the data to be written. By performing the operations associated with the first table section 601, the second table section 602, and the third table section 603, the data to be written is recovered (e.g., the SDC column 677, the $PDC_0$ column 678) such that the data can be re-written after the aborted write has been aborted, thereby protecting the data to be written.

Figure 7:
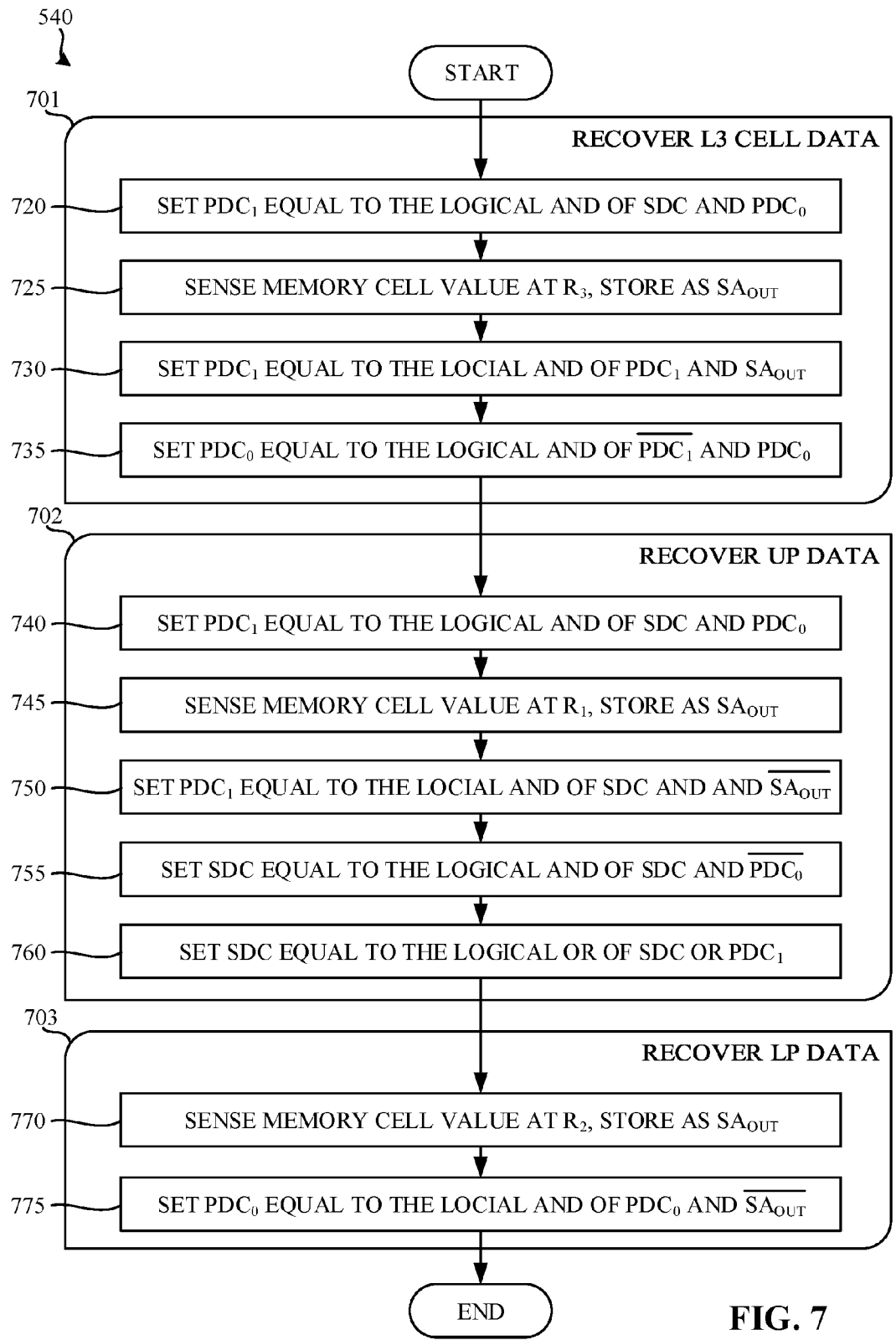
FIG. 7 is a flowchart representative of example machine-readable instructions which, when executed, cause the example solid state drive of FIG. 1 to recover data written prior to a write abort during a power loss event.

FIG. 7 is a flowchart 540 representative of example machine-readable instructions which, when executed, cause the example SSD 110 of FIG. 1 to recover data written prior to an abort during a power loss event. In examples disclosed herein, the example machine-readable instructions of FIG. 7 may also be used to implement the example process 541 of FIG. 5B. The example process 540 of FIG. 7 includes three phases 701, 702, 703. The example first phase 701 corresponds to the first table section 601 of FIG. 6. The example second phase 702 corresponds to the second table section 602 of FIG. 6. The example third phase 703 corresponds to the third table section 603 of FIG. 6.

The example first phase 701 is executed to recover data from a memory cell (e.g., the memory cell 185 of FIG. 1) that has passed the third level $L_3$ (e.g., the third level $L_3$ 283 of FIG. 2A). With respect to the illustrated example of FIG. 2A, if a memory cell has passed $L_3$, the memory cell may be in the process of transitioning along transition indicator 237 and/or transition indicator 238 of FIG. 2A. The example first phase 701 begins when the example block controller 170 of FIG. 1 sets the $PDC_1$ 177 of FIG. 1 equal to the logical and of the SDC 179 of FIG. 1 and the $PDC_0$ 175 of FIG. 1. (Block 720). Block 720 of FIG. 7 corresponds to the first column 620 of FIG. 6. Setting the $PDC_1$ 177 equal to the logical and of the SDC 179 and the $PDC_0$ 175 masks out instances where the memory cell 185 has failed the transition to the $L_1$, $L_2$, or $L_3$ state (e.g., rows 609, 610, 611 are masked).

Using the example sense latch ($SA_{OUT}$) 183 of FIG. 1, the example block controller 170 performs a sense operation at a first $V_t$ value. (Block 725). In the illustrated example of FIG. 7, the first $V_t$ value corresponds to a $V_t$ value of $R_3$ (e.g., the $R_3$ 273 of FIG. 2A). Block 725 of FIG. 7 corresponds to the second column 625 of FIG. 6. If the $V_t$ value of the memory cell 185 is greater than $R_3$, a binary zero results (e.g., a binary zero is written to the sense latch ($SA_{OUT}$) 183). If the $V_t$ value of the memory cell 185 is less than or equal to $R_3$, a binary one results (e.g., a binary one is written to the sense latch ($SA_{OUT}$) 183). In the example first table section 601 of FIG. 6, the $L_3$ pass row 608 indicates a binary one as a result of the sense operation, whereas the other rows (e.g., rows 605, 606, 607, 609, 610, and 611) indicate a binary zero. In the illustrated example of FIG. 7, the result of the sensing operation is stored in the sense latch ($SA_{OUT}$) 183. However, the result of the sensing operation may be stored in any other fashion.

The example block controller 170 sets the $PDC_1$ 177 equal to the logical and of $PDC_1$ 177 (as set in association with Block 720), and the sense latch ($SA_{OUT}$) 183 (as set in association with Block 725). (Block 730). Block 725 of FIG. 7 corresponds to the third column 625 of FIG. 6. The example block controller 170 sets the $PDC_0$ 175 to the logical and of the inverse of $PDC_1$ 177 (as set in association with Block 730) and $PDC_0$ 175. (Block 735).

The logical operations of the first phase 701 (e.g., Block 720, Block 725, Block 730, Block 735) operate to recover the LP data for when the memory cell 185 has passed the $L_3$ state (e.g., corresponding to row 608). As shown, the data stored the SDC 179 and $PDC_0$ 175 prior to the operations of the first phase 701 was a binary one-one when the memory cell 185 had passed $L_3$ (e.g., row 608). In contrast, after performance of the first phase 701, the data stored in the SDC 179 and $PDC_0$ 175 is a binary one-zero.

The second example phase 702 is executed to recover the UP data that was to be written to the memory cell 185. In some examples, the abort operation may occur after the UP data has been written to the memory cell 185 by the block controller 170 (e.g., as represented by the $L_0$ row 605, the $L_1$ pass row 606, and/or the $L_2$ pass row 607). In such examples, the UP data is recovered using the example operations of phase 702. The example block controller 170 sets the $PDC_1$ equal to the logical and of the SDC 179 and the $PDC_0$ (as set in association with Block 735). (Block 740). Block 740 of FIG. 7 corresponds to the fifth column 640 of FIG. 6.

Using the example sense latch ($SA_{OUT}$) 183, the example block controller 170 performs a sense operation at a second $V_t$ value. (Block 745). In the illustrated example of FIG. 7, the second $V_t$ value corresponds to a $V_t$ value of $R_1$ (e.g., the $R_1$ 271 of FIG. 2A). Block 745 of FIG. 7 corresponds to the second column 625 of FIG. 6. If the $V_t$ value of the memory cell 185 is greater than $R_1$ 271, a binary zero results (e.g., a binary zero is written to the sense latch ($SA_{OUT}$) 183). If the $V_t$ value of the memory cell 185 is less than or equal to $R_1$ 271, a binary one results (e.g., a binary one is written to the sense latch ($SA_{OUT}$) 183). In the example second table section 602 of FIG. 6, the $L_1$ pass row 606, the $L_2$ pass row 607, the $L_3$ pass row 608, the $L_2$ fail row 610, and the $L_3$ fail row 611 indicate a binary one as a result of the sense operation (e.g., a binary one is written to the sense latch ($SA_{OUT}$) 183), whereas the $L_0$ row 605 and the $L_1$ fail row 609 indicate a binary zero as a result of the sense operation (e.g., a binary zero is written to the sense latch ($SA_{OUT}$) 183). In the illustrated example of FIG. 7, the result of the sensing operation is stored in the sense latch ($SA_{OUT}$) 183. However, the result of the sensing operation may be stored in any other fashion.

The example block controller 170 sets the $PDC_1$ equal to the logical and of $PDC_1$ 177 (as set in association with Block 740), and the logical inverse of the sense latch ($SA_{OUT}$) 183 (as set in association with Block 745). (Block 750). Block 750 of FIG. 7 corresponds to the seventh column 650 of FIG. 6. The example block controller 170 sets the SDC 179 equal to the logical and of the SDC 179 and logical inverse of the $PDC_0$ 175 (as set in association with Block 735). (Block 755). Block 755 of FIG. 7 corresponds to the eighth column 655 of FIG. 6. In examples disclosed herein, the operation of Block 755 ensures that the UP data of the memory cell 185 in a state associated with the $L_0$ row 605 is differentiated from the memory cell in a state associated with either the $L_1$ pass row 606 or the $L_2$ pass row 607. The example block controller 170 sets the SDC 179 to the logical or of the SDC 179 (as set in association with Block 755) and the $PDC_1$ 177 (as set in association with Block 750). Block 760 of FIG. 7 corresponds to the ninth column 670 of FIG. 6.

The logical operations of the second phase 702 (e.g., Block 740, Block 745, Block 750, Block 755, Block 760) operate to recover the UP data for when the memory cell 185 has not passed the $L_3$ state (e.g., corresponding to row 608).

The third example phase 703 is executed to recover the LP data that was to be written to the memory cell 185. In some examples, the abort operation may occur after the LP data has been written to the memory cell 185 by the block controller 170 (e.g., as represented by the $L_0$ row 605, the $L_1$ pass row 606, and/or the $L_2$ pass row 607). In such examples, the LP data is recovered using the example operations of the third example phase 703.

Using the example sense latch ($SA_{OUT}$) 183, the example block controller 170 performs a sense operation at a third $V_t$ value. (Block 770). In the illustrated example of FIG. 7, the third $V_t$ value corresponds to a $V_t$ value of $R_2$ (e.g., the $R_2$ 272 of FIG. 2A). Block 770 of FIG. 7 corresponds to the tenth column 670 of FIG. 6. If the $V_t$ value of the memory cell 185 is greater than $R_2$ 272, a binary zero results (e.g., a binary zero is written to the sense latch ($SA_{OUT}$) 183). If the $V_t$ value of the memory cell 185 is less than or equal to $R_2$ 272, a binary one results (e.g., a binary one is written to the sense latch ($SA_{OUT}$) 183). In the example third table section 603 of FIG. 6, the $L_2$ pass row 607, and the $L_3$ pass row 608 indicate a binary one as a result of the sense operation, whereas the $L_0$ row 605, the $L_1$ pass row 606, the $L_1$ fail row 609, the $L_2$ fail row 610, and the $L_3$ fail row 611 indicate a binary zero as a result of the sense operation (e.g., a binary zero is written to the sense latch ($SA_{OUT}$) 183). In the illustrated example of FIG. 7, the result of the sensing operation is stored in the sense latch ($SA_{OUT}$) 183. However, the result of the sensing operation may be stored in any other fashion.

The example block controller 170 sets the $PDC_0$ 175 to the logical and of the $PDC_0$ (as set in association with Block 735) and the logical inverse of the sense latch ($SA_{OUT}$) 183 (as set in association with Block 770). (Block 775). Block 775 of FIG. 7 corresponds to the eleventh column 675 of FIG. 6. As a result of the operations of the third phase 703, the LP and UP data that was to be written to the memory cell is recovered in the SDC 179 and the $PDC_0$ 175. The example process 540 of FIG. 7 terminates. The example process 500 of FIG. 5A (and/or the example process 501 of FIG. 5B) continues, where the LP and/or UP data are re-written to the memory cell, thereby protecting the LP and/or UP data from corruption as a result of the power loss event.

Figure 8:
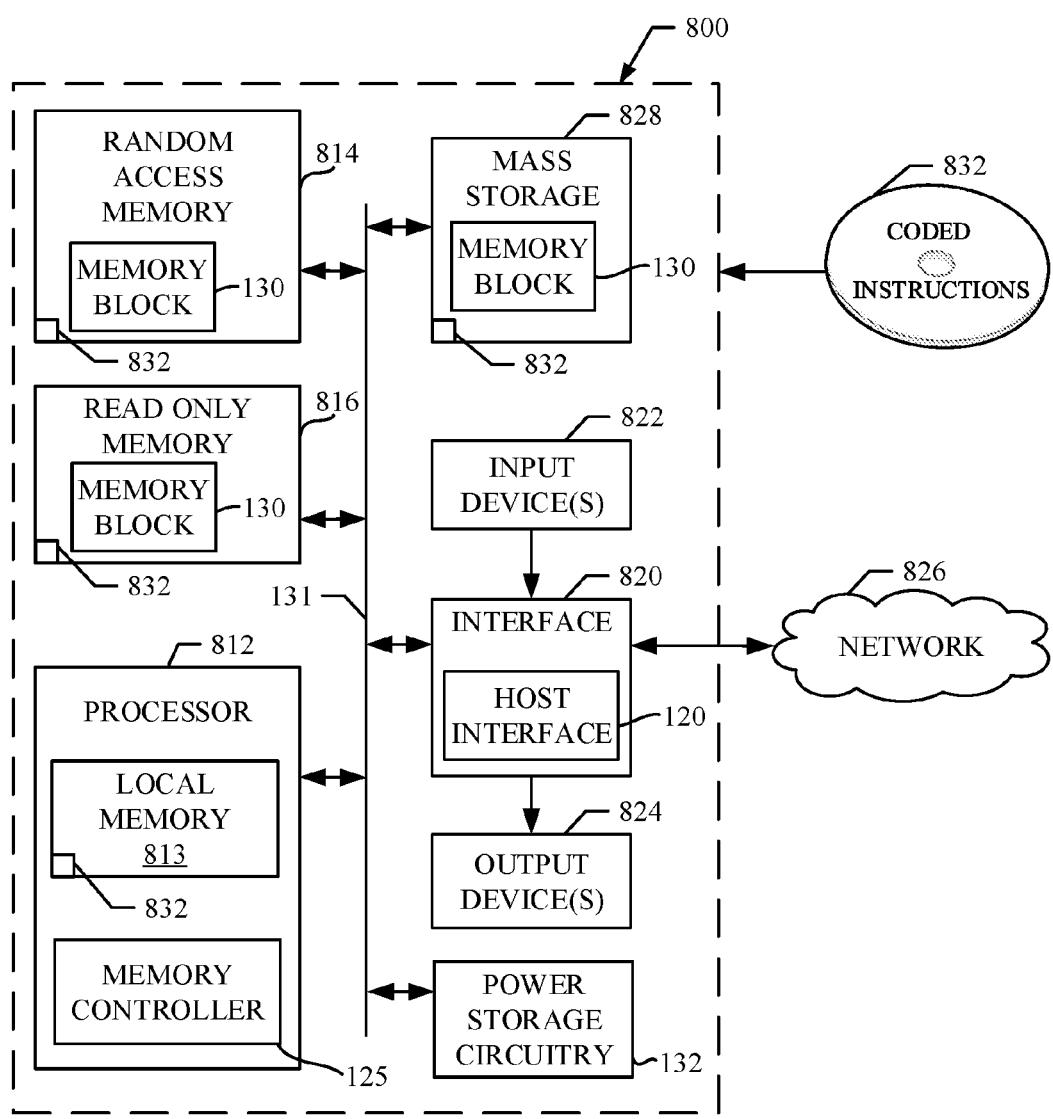
FIG. 8 is a block diagram of an example processor platform capable of executing the instructions of FIGS. 3, 4, 5A, 5B, and/or 7 to implement the example solid state drive of FIG. 1.

FIG. 8 is a block diagram of an example processor platform 800 capable of executing the instructions of FIGS. 3, 4, 5A, 5B, and/or 7 to implement the SSD 110 of FIG. 1. The processor platform 800 can be, for example, a solid state drive (SSD), a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer.

The processor 812 of the illustrated example includes a local memory 813 (e.g., a cache). The processor 812 of the illustrated example is in communication with a main memory including a random access memory 814 and a read only memory 816 via the bus 131. The random access memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The read only memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 820 of the illustrated example, thus, typically includes a graphics driver card, a graphics driver chip or a graphics driver processor.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID systems, and digital versatile disk (DVD) drives.

The coded instructions 832 of FIGS. 3, 4, 5A, 5B, and/or 7 may be stored in the mass storage device 828, in the random access memory 814, in the read only memory 816, and/or on a removable tangible computer readable storage medium such as a CD or DVD.

From the foregoing, it will be appreciated that the above disclosed methods, apparatus and articles of manufacture enable preservation of data of the SSD 110 during a power failure event. Moreover, in some examples, the example methods, apparatus, and articles of manufacture disclosed herein enable a reduction of a power requirement of the SSD 110 during the power failure event.

For example, whereas completion of an ongoing TLC write operation may take approximately five thousand micro seconds, aborting ongoing writes, recovering the data to be written, and re-writing the data to be written in a different mode may take approximately three thousand micro seconds. In examples disclosed herein, such an approach yields a reduction in the amount of time that the SSD 110 is to be operated using energy stored in the energy storage circuitry after a power loss event of approximately forty percent, as compared to allowing write operations to be completed.

Further still, in some examples, instead of re-writing data to the aborted cell, recovered data may be written to memory operating in a dedicated SLC mode. In some examples, such an approach takes approximately one thousand and nine hundred micro seconds. In examples disclosed herein, such an approach yields a reduction in the amount of time that the SSD 110 is to be operated using energy stored in the energy storage circuitry after a power loss event of approximately sixty two percent, as compared to allowing write operations to be completed. Moreover, such an approach yields a reduction in the amount of energy used to operate the SSD 110 after a power loss event of approximately twenty percent as compared to re-writing a first portion of the data to the aborted cell and a second portion of the data to a memory cell different from the aborted cell.

Using the example approaches disclosed herein, the reduction in the amount of time that the SSD 110 uses energy stored in the energy storage circuitry after the power loss event likewise results in a reduction in the amount of energy storage devices and/or capacity (e.g., capacitors, batteries, etc.) required by the SSD 110. Such a reduction results in additional physical space within the SSD 110 that may be used for other components of the SSD 110 (e.g., additional memory capacity). In some examples, the reduction in amount of energy storage devices and/or capacity results in a reduction of the overall size of the SSD (e.g., enabling smaller form factor SSDs), because, for example, smaller and/or lower capacity energy storage circuitry may be used. Moreover, utilizing the approaches disclosed herein ensures that data that was in the process of being written during a power loss event will not become corrupted.

Example 1 is an apparatus. The apparatus of Example 1 includes a non-volatile memory. The apparatus of Example 1 further includes a non-volatile memory controller to, upon detection of a power loss event, abort the ongoing write operation of the aborted memory cell, the nonvolatile memory controller to write, to a first memory cell, a first portion of the data to be written to the aborted memory cell, the non-volatile memory controller to write, to a second memory cell, a second portion of the data to be written to the aborted memory cell.

Example 2 includes the subject matter of Example 1, wherein the first portion of the data to be written is a lower page of the data to be written.

Example 3 includes the subject matter of Example 1, wherein the second portion of the data to be written is an upper page of the data to be written.

Example 4 includes the subject matter of any one of Examples 1-3, wherein the non-volatile memory controller is further to write, to a third memory cell different from the first memory cell and the second memory cell, a third portion of the data to be written to the first memory cell.

Example 5 includes the subject matter of any one of Examples 1-4, wherein the third portion of the data is an extra page of the data to be written.

Example 6 includes the subject matter of any one of Examples 1-5, wherein the first portion of the data to be written is a lower page and an upper page of the data to be written, and the second portion of the data to be written is an extra page of the data to be written.

Example 7 includes the subject matter of any one of Examples 1-6, further including a power loss event detector to detect the power loss event.

Example 8 includes the subject matter of any one of Examples 1-7, wherein the apparatus is to reduce a power requirement of the SSD during the power loss event.

Example 9 includes the subject matter of any one of Examples 1-8, wherein the aborted memory cell is located in a first memory block, and the first memory cell is located in a second memory block separate from the first memory block.

Example 10 includes the subject matter of Example 9, wherein the second memory block is operated in a dedicated single level cell mode.

Example 11 includes the subject matter of Example 9, wherein the first memory block is located in a first memory die, and the second memory block is located in a second memory die separate from the first memory die.

Example 12 includes the subject matter of any one of Examples 1-11, wherein the first memory cell is the aborted memory cell.

Example 13 includes the subject matter of Example 12, wherein the first portion of the data is written to the aborted memory cell using a first threshold voltage distribution, the first threshold voltage distribution different from a second threshold voltage distribution used by the aborted memory cell prior to receipt of the command to abort the ongoing write operation.

Example 14 includes the subject matter of any one of Examples 1-13, wherein to abort the ongoing write operation, the non-volatile memory controller includes an abort instructor to send a command to abort the ongoing write operation upon detection of the power loss event.

Example 15 is a method. The method of Example 15 includes sending, upon detection of a power loss event, from a processor of the solid state drive, a command to abort an ongoing write operation of an aborted memory cell. In response to an indication that the ongoing write operation is aborted, the data to be written to the aborted memory cell is recovered. A first portion of the data to be written to the aborted memory cell is written to a first memory cell. A second portion of the data to be written to the aborted memory cell is written to a second memory cell.

Example 16 includes the subject matter of Example 15, wherein the first memory cell is the aborted memory cell.

Example 17 includes the subject matter of Example 15, wherein the first memory cell is different from the aborted memory cell.

Example 18 includes the subject matter of any one of Examples 15-17, wherein the second memory cell is different from the aborted memory cell and the first memory cell.

Example 19 includes the subject matter of any one of Examples 15-18, wherein the aborted memory cell is included in a first memory block, and the first memory cell and the second memory cell are included in a separate memory block separate from the first memory block.

Example 20 includes the subject matter of Example 19, wherein the second memory block is operated in a dedicated single level cell mode.

Example 21 includes the subject matter of Example 19, wherein the first portion of the data to be written is a lower page of the data to be written.

Example 22 includes the subject matter of any one of Examples 15-21, wherein the second portion of the data to be written is an upper page of the data to be written.

Example 23 includes the subject matter of any one of Examples 15-22, further including writing, to a third memory cell different from the first memory cell and the second memory cell, a third portion of the data to be written to the aborted memory cell.

Example 24 includes the subject matter of Example 23, wherein the third portion of the data is an extra page of the data to be written.

Example 25 includes the subject matter of any one of Examples 15-24, wherein the first portion of the data to be written is a lower page and an upper page of the data to be written, and the second portion of the data to be written is an extra page of the data to be written.

Example 26 includes the subject matter of any one of Examples 15-25, further including detecting the power loss event.

Example 27 includes the subject matter of any one of Examples 15-26, wherein the recovery of the data to be written reduces a power requirement of the SSD during the power loss event.

Example 28 includes the subject matter of any one of Examples 15-27, wherein the recovery of the data to be written to the first memory cell includes, in order, setting an alternate data cache equal to a logical AND of a secondary data cache and a primary data cache. A first sense operation is performed at a first sensing threshold. The alternate data cache is set equal to a logical AND of the alternate data cache and a first result of the first sense operation. The primary data cache is set equal to a logical AND of the primary data cache and an inverted value of the alternate data cache. The alternate data cache is set equal to the logical AND of the secondary data cache and the primary data cache. A second sense operation is performed at a second sensing threshold. The alternate data cache is set equal to the logical AND of the alternate data cache and an inverted value of a second result of the second sense operation. The secondary data cache is set equal to the logical AND of the secondary data cache and the primary data cache. The secondary data cache is set equal to the logical OR of the secondary data cache or the primary data cache. A third sense operation is performed at a third sensing threshold. The primary data cache is set equal to the logical AND of the primary data cache and a third result of the third sensing operation.

Example 29 is at least one machine readable storage device comprising instructions that, when executed, cause one or more processors to send, upon detection of the power loss event, from a processor of the solid state drive, a command to abort an ongoing write operation of an aborted memory cell. In response to an indication that the ongoing write operation was aborted, the one or more processors is to recover the data to be written to the aborted memory cell. A first portion of the data to be written to the aborted memory cell is written to a first memory cell. A second portion of the data to be written to the aborted memory cell is written to a second memory cell.

Example 30 includes the subject matter of Example 29, wherein the first memory cell is the aborted memory cell.

Example 31 includes the subject matter of Example 29, wherein the first memory cell is different from the aborted memory cell.

Example 32 includes the subject matter of any one of Examples 29-31, wherein the second memory cell is different from the aborted memory cell and the first memory cell.

Example 33 includes the subject matter of any one of Examples 29-32, wherein the aborted memory cell is included in a first memory block, and the first memory cell and the second memory cell are included in a separate memory block separate from the first memory block.

Example 34 includes the subject matter of Example 33, wherein the second memory block is operated in a dedicated single level cell mode.

Example 35 includes the subject matter of any one of Examples 29-34, wherein the first portion of the data to be written is a lower page of the data to be written.

Example 36 includes the subject matter of any one of Examples 29-35, wherein the second portion of the data to be written is an upper page of the data to be written.

Example 37 includes the subject matter of any one of Examples 29-36, further including instructions which, when executed, cause the one or more processors to write, to a third memory cell different from the first memory cell and the second memory cell, a third portion of the data to be written to the first memory cell.

Example 38 includes the subject matter of Example 37, wherein the third portion of the data is an extra page of the data to be written.

Example 39 includes the subject matter of any one of Examples 29-38, wherein the first portion of the data to be written is a lower page and an upper page of the data to be written, and the second portion of the data to be written is an extra page of the data to be written.

Example 40 includes the subject matter of any one of Examples 29-39, wherein the instructions, when executed, cause the one or more processors to detect the power loss event.

Example 41 includes the subject matter of any one of Examples 29-40, wherein the recovery of the data to be written reduces a power requirement of the SSD during the power loss event.

Example 42 includes the subject matter of any one of Examples 29-41, wherein the instructions, when executed, cause the one or more processors to, in order, set an alternate data cache equal to a logical AND of a secondary data cache and a primary data cache. A first sense operation is performed at a first sensing threshold. The alternate data cache is set equal to a logical AND of the alternate data cache and a first result of the first sense operation. The primary data cache is set equal to a logical AND of the primary data cache and an inverted value of the alternate data cache. The alternate data cache is set equal to the logical AND of the secondary data cache and the primary data cache. A second sense operation is performed at a second sensing threshold. The alternate data cache is set equal to the logical AND of the alternate data cache and an inverted value of a second result of the second sense operation. The secondary data cache is set equal to the logical AND of the secondary data cache and the primary data cache. The secondary data cache is set equal to the logical OR of the secondary data cache or the primary data cache. A third sense operation is performed at a third sensing threshold. The primary data cache is set equal to the logical AND of the primary data cache and a third result of the third sensing operation.

Example 43 is an apparatus. The apparatus of Example 43 includes a non-volatile memory means. The apparatus of Example 43 includes a non-volatile memory controller means to, upon detection of the power loss event, abort the ongoing write operation of the aborted memory cell, the non-volatile memory controller means to write, to a first memory cell, a first portion of the data to be written to the aborted memory cell, the non-volatile memory controller means to write, to a second memory cell, a second portion of the data to be written to the aborted memory cell.

Example 44 includes the subject matter of Example 43, wherein the first portion of the data to be written is a lower page of the data to be written.

Example 45 includes the subject matter of Example 43, wherein the second portion of the data to be written is an upper page of the data to be written.

Example 46 includes the subject matter of any one of Examples 43-45, wherein the non-volatile memory controller means is further to write, to a third memory cell different from the first memory cell and the second memory cell, a third portion of the data to be written to the first memory cell.

Example 47 includes the subject matter of Example 46, wherein the third portion of the data is an extra page of the data to be written.

Example 48 includes the subject matter of any one of Examples 43-47, wherein the first portion of the data to be written is a lower page and an upper page of the data to be written, and the second portion of the data to be written is an extra page of the data to be written.

Example 49 includes the subject matter of any one of Examples 43-48, further including a means for detecting the power loss event.

Example 50 includes the subject matter of any one of Examples 43-49, wherein the apparatus is to reduce a power requirement of the SSD during the power loss event.

Example 51 includes the subject matter of any one of Examples 43-51, wherein the aborted memory cell is located in a first memory block, and the first memory cell is located in a second memory block separate from the first memory block.

Example 52 includes the subject matter of Example 51, wherein the second memory block is operated in a dedicated single level cell mode.

Example 53 includes the subject matter of Example 51, wherein the first memory block is located in a first memory die, and the second memory block is located in a second memory die separate from the first memory die.

Example 54 includes the subject matter of any one of Examples 43-53, wherein the first memory cell is the aborted memory cell.

Example 55 includes the subject matter of Example 54, wherein the first portion of the data is written to the aborted memory cell using a first threshold voltage distribution, the first threshold voltage distribution different from a second threshold voltage distribution used by the aborted memory cell prior to receipt of the command to abort the ongoing write operation.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
    a first memory cell;
    a primary data cache;
    an alternate data cache;
    a secondary data cache, the primary data cache, the alternate data cache, and the secondary data cache to store at least a portion of data while the data is written to the first memory cell; and
    a non-volatile memory controller to, in response to an instruction to abort a write operation to the first memory cell:
        set the alternate data cache equal to a logical AND of the secondary data cache and the primary data cache;
        perform a first sense operation of the first memory cell at a first sensing threshold;
        set the alternate data cache equal to a logical AND of the alternate data cache and a first result of the first sense operation;
        set the primary data cache equal to a logical AND of the primary data cache and an inverse value of the alternate data cache;
        set the alternate data cache equal to a logical AND of the secondary data cache and the primary data cache;
        perform a second sense operation of the first memory cell at a second sensing threshold;
        set the alternate data cache equal to a logical AND of the alternate data cache and an inverse value of a second result of the second sense operation;
        set the secondary data cache equal to a logical AND of the secondary data cache and the primary data cache;
        set the secondary data cache equal to a logical OR of the secondary data cache or the primary data cache;
        perform a third sense operation of the first memory cell at a third sensing threshold; and
        set the primary data cache equal to a logical AND of the primary data cache and a third result of the third sensing operation.

2. The apparatus as defined in claim 1, wherein the non-volatile memory controller is further to, upon the setting of the primary data cache equal to the logical AND of the primary data cache and a third result of the third sensing operation:
    write, to a second memory cell, the data stored in the primary data cache; and
    write, to a third memory cell, the data stored in the secondary data cache.

3. The apparatus as defined in claim 2, wherein the second memory cell is the first memory cell.

4. The apparatus as defined in claim 2, wherein the second memory cell is separate from the first memory cell.

5. The apparatus as defined in claim 2, wherein the third memory cell is separate from the first memory cell and the second memory cell.

6. The apparatus as defined in claim 2, wherein the first memory cell is included in a first memory block, and the second memory cell and the third memory cell are included in a second memory block separate from the first memory block.

7. The apparatus as defined in claim 6, wherein the second memory block is operated in a dedicated single level cell mode.

8. The apparatus as defined in claim 1, further including:
    an energy storage circuit;
    a power loss event detector to detect a main power loss event; and
    an abort instructor to, using energy stored in the energy storage circuit, provide the instruction to abort the ongoing write operation to the non-volatile memory controller in response to the detection of the main power loss event.

9. A method for recovering data to be written to an aborted memory cell, the method comprising:
    setting an alternate data cache equal to a logical AND of a secondary data cache and a primary data cache, wherein the alternate data cache, the secondary data cache, and the primary data cache are to store at least a portion of data while the data is written to the aborted memory cell;
    performing a first sense operation of the aborted memory cell at a first sensing threshold;
    setting the alternate data cache equal to a logical AND of the alternate data cache and a first result of the first sense operation;
    setting the primary data cache equal to a logical AND of the primary data cache and an inverse value of the alternate data cache;
    setting the alternate data cache equal to a logical AND of the secondary data cache and the primary data cache;
    performing a second sense operation of the aborted memory cell at a second sensing threshold;
    setting the alternate data cache equal to a logical AND of the alternate data cache and an inverse value of a second result of the second sense operation;
    setting the secondary data cache equal to a logical AND of the secondary data cache and the primary data cache;
    setting the secondary data cache equal to a logical OR of the secondary data cache or the primary data cache;
    performing a third sense operation of the aborted memory cell at a third sensing threshold; and
    setting the primary data cache equal to a logical AND of the primary data cache and a third result of the third sensing operation.

10. The method as defined in claim 9, further including, upon the setting of the primary data cache equal to the logical AND of the primary data cache and a third result of the third sensing operation:
    writing, to a first memory cell, the data stored in the primary data cache; and
    writing, to a second memory cell, the data stored in the secondary data cache.

11. The method as defined in claim 10, wherein the first memory cell is the aborted memory cell.

12. The method as defined in claim 10, wherein the first memory cell is separate from the aborted memory cell.

13. The method as defined in claim 10, wherein the second memory cell is separate from the aborted memory cell and the first memory cell.

14. The method as defined in claim 10, wherein the aborted memory cell is included in a first memory block, and the first memory cell and the second memory cell are included in a second memory block separate from the first memory block.

15. The method as defined in claim 14, wherein the second memory block is operated in a dedicated single level cell mode.

16. At least one tangible machine readable storage medium comprising instructions that, when executed, cause one or more processors to at least:
   set an alternate data cache equal to a logical AND of a secondary data cache and a primary data cache, wherein the alternate data cache, the secondary data cache, and the primary data cache are to store at least a portion of data while the data is written to a memory cell;
   perform a first sense operation of the memory cell at a first sensing threshold;
   set the alternate data cache equal to a logical AND of the alternate data cache and a first result of the first sense operation;
   set the primary data cache equal to a logical AND of the primary data cache and an inverse value of the alternate data cache;
   set the alternate data cache equal to a logical AND of the secondary data cache and the primary data cache;
   perform a second sense operation of the memory cell at a second sensing threshold;
   set the alternate data cache equal to a logical AND of the alternate data cache and an inverse value of a second result of the second sense operation;
   set the secondary data cache equal to a logical AND of the secondary data cache and the primary data cache;
   set the secondary data cache equal to a logical OR of the secondary data cache or the primary data cache;
   perform a third sense operation of the memory cell at a third sensing threshold; and
   set the primary data cache equal to a logical AND of the primary data cache and a third result of the third sensing operation.

17. The at least one tangible machine readable storage medium as defined in claim 16, wherein the instructions, when executed, further cause the machine to, upon the setting of the primary data cache equal to a logical AND of the primary data cache and a third result of the third sensing operation:
   write, to a first memory cell, the data stored in the primary data cache; and
   write, to a second memory cell, the data stored in the secondary data cache.

18. The at least one tangible machine readable storage medium as defined in claim 17, wherein the first memory cell is the aborted memory cell.

19. The at least one tangible machine readable storage medium as defined in claim 17, wherein the first memory cell is separate from the aborted memory cell.

20. The at least one tangible machine readable storage medium as defined in claim 17, wherein the aborted memory cell is included in a first memory block, and the first memory cell and the second memory cell are included in a second memory block separate from the first memory block.

* * * * *